(12) United States Patent
Schumann et al.

(10) Patent No.: US 10,283,715 B2
(45) Date of Patent: May 7, 2019

(54) CONDUCTIVE POLYMER IN ORGANIC SOLVENT WITH FLUORINATED COMPOUND

(71) Applicant: Heraeus Deutschland GmbH & Co. KG, Hanau (DE)

(72) Inventors: Stefan Schumann, Köln (DE); Nina Kausch-Busies, Bergisch Gladbach (DE); Wilfried Lövenich, Bergisch-Gladbach (DE); Jan Sütterlin, Köln (DE); Andreas Elschner, Mülheim (DE); Arnulf Scheel, Köln (DE)

(73) Assignee: HERAEUS DEUTSCHLAND GMBH & CO. KG, Hanau (DE)

(*) Notice: Subject to any disclaimer, the term of this patent is extended or adjusted under 35 U.S.C. 154(b) by 0 days.

(21) Appl. No.: 15/554,345

(22) PCT Filed: Mar. 9, 2016

(86) PCT No.: PCT/EP2016/055057
§ 371 (c)(1),
(2) Date: Aug. 29, 2017

(87) PCT Pub. No.: WO2016/142437
PCT Pub. Date: Sep. 15, 2016

(65) Prior Publication Data
US 2018/0182965 A1    Jun. 28, 2018

(30) Foreign Application Priority Data
Mar. 9, 2015    (EP) .................................. 15158257

(51) Int. Cl.
*H01L 27/32*    (2006.01)
*H01L 51/00*    (2006.01)
(Continued)

(52) U.S. Cl.
CPC .......... *H01L 51/0035* (2013.01); *B32B 27/06* (2013.01); *B32B 27/281* (2013.01);
(Continued)

(58) Field of Classification Search
CPC ..... H01L 27/32; H01L 27/325; H01L 27/302; H01L 27/304
See application file for complete search history.

(56) References Cited

U.S. PATENT DOCUMENTS

2004/0214985 A1   10/2004   Martin et al.
2006/0180810 A1   8/2006   Lee et al.
(Continued)

FOREIGN PATENT DOCUMENTS

CN    1615324    5/2005
CN    101036198    9/2007
(Continued)

OTHER PUBLICATIONS

Kawano et al, "Degradation of organic solar cells due to air exposure", Solar Energy Materials & Solar Cells, vol. 90, 2006, pp. 3520-3530.
(Continued)

*Primary Examiner* — Phuc Dang
(74) *Attorney, Agent, or Firm* — Blank Rome LLP

(57) ABSTRACT

The present invention relates to a composition comprising:
a) at least one organic solvent;
b) at least one conductive polymer, preferably a cationic polymer;
c) at least one fluorinated compound;
d) at least one polymeric anion, wherein the at least one polymeric anion is a copolymer comprising ionic and non-ionic repeating units.
The present invention also relates to a layered structure comprising the composition, to a process for the production
(Continued)

of the composition, to a process for the production of the layered structure and to devices comprising the layered structure as well as to the use of the composition in devices to achieve a prolongation of lifetime.

19 Claims, 1 Drawing Sheet

(51) Int. Cl.

| | | |
|---|---|---|
| C09D 141/00 | (2006.01) | |
| B32B 27/30 | (2006.01) | |
| C08L 53/02 | (2006.01) | |
| C09D 5/24 | (2006.01) | |
| B32B 27/06 | (2006.01) | |
| B32B 27/28 | (2006.01) | |
| B32B 27/32 | (2006.01) | |
| B32B 27/34 | (2006.01) | |
| B32B 27/36 | (2006.01) | |
| H01L 51/50 | (2006.01) | |

(52) U.S. Cl.
CPC ............ *B32B 27/286* (2013.01); *B32B 27/30* (2013.01); *B32B 27/302* (2013.01); *B32B 27/304* (2013.01); *B32B 27/32* (2013.01); *B32B 27/325* (2013.01); *B32B 27/34* (2013.01); *B32B 27/36* (2013.01); *B32B 27/365* (2013.01); *C08L 53/025* (2013.01); *C09D 5/24* (2013.01); *C09D 141/00* (2013.01); *H01L 51/0037* (2013.01); *H01L 51/0043* (2013.01); *H01L 51/0094* (2013.01); *B32B 2250/44* (2013.01); *B32B 2255/10* (2013.01); *B32B 2255/26* (2013.01); *B32B 2307/202* (2013.01); *B32B 2457/12* (2013.01); *B32B 2457/20* (2013.01); *B32B 2457/206* (2013.01); *B32B 2457/208* (2013.01); *H01L 51/5088* (2013.01); *Y02E 10/549* (2013.01)

(56) References Cited

U.S. PATENT DOCUMENTS

| | | | |
|---|---|---|---|
| 2007/0069185 A1* | 3/2007 | Hsu | C09D 165/00 252/500 |
| 2007/0129473 A1 | 6/2007 | Shin et al. | |
| 2008/0020208 A1* | 1/2008 | Lee | H01L 51/0035 428/411.1 |
| 2008/0116414 A1* | 5/2008 | Moren | D06M 13/17 252/8.62 |
| 2010/0040966 A1* | 2/2010 | Gu | G03G 17/04 430/37 |
| 2011/0026116 A1 | 2/2011 | Nishimura et al. | |
| 2011/0026126 A1 | 2/2011 | Takada et al. | |
| 2012/0179217 A1* | 7/2012 | Bates | B22F 1/0055 607/5 |
| 2013/0328018 A1 | 12/2013 | Chen et al. | |
| 2015/0037567 A1* | 2/2015 | Clear | C09D 7/48 428/331 |
| 2015/0299506 A1* | 10/2015 | Fan | C08F 220/28 507/225 |

FOREIGN PATENT DOCUMENTS

| | | |
|---|---|---|
| DE | 102008023008 | 11/2009 |
| EP | 1003178 | 5/2000 |
| JP | 2011501369 | 1/2011 |
| WO | WO-2008022908 | 2/2008 |
| WO | WO-2009069990 | 6/2009 |
| WO | WO-2010022353 | 2/2010 |
| WO | WO-2010112680 | 10/2010 |
| WO | WO-2012002246 | 1/2012 |

OTHER PUBLICATIONS

International Search Report issued in PCT/EP2016/055057 dated Jun. 28, 2016.

* cited by examiner

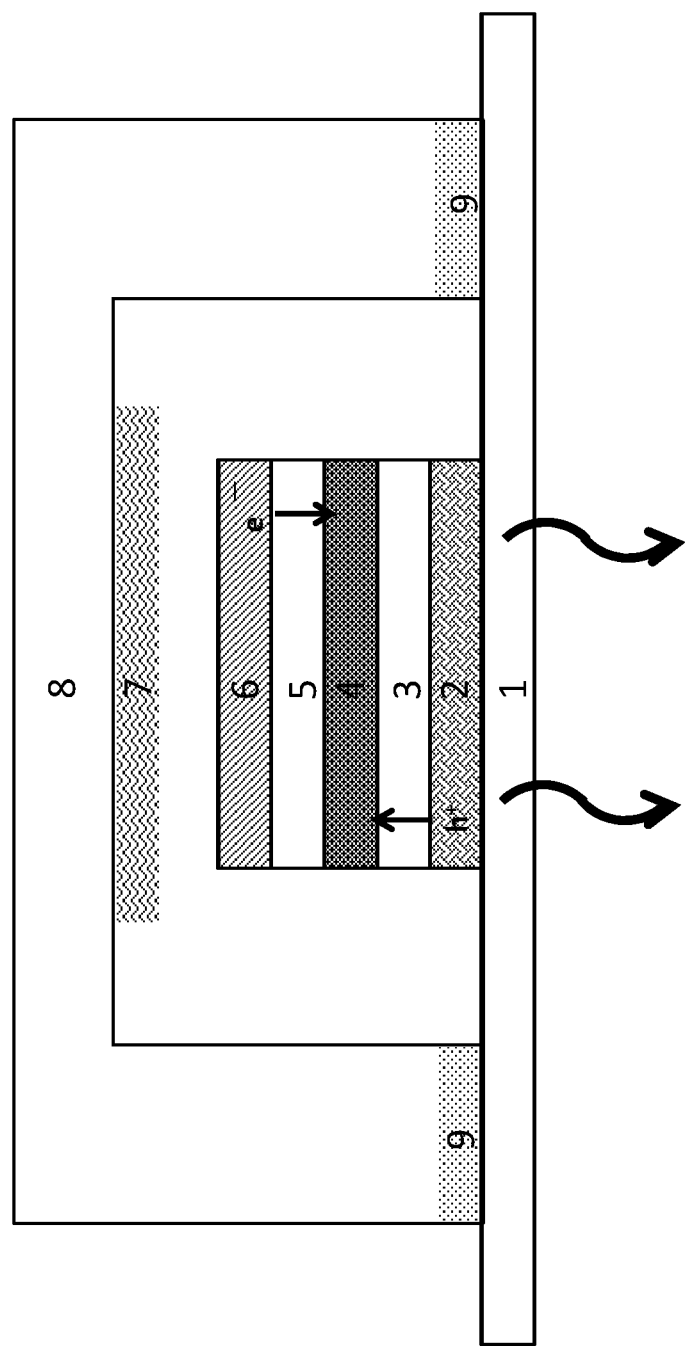

CONDUCTIVE POLYMER IN ORGANIC SOLVENT WITH FLUORINATED COMPOUND

This application is a national stage of International Patent Application No. PCT/EP2016/055057, filed Mar. 9, 2016, which claims the benefit of European Patent Application No. 15158257.4, filed Mar. 9, 2015, each of which is hereby incorporated by reference in its entirety.

The present invention relates to a composition comprising at least one organic solvent a), at least one conductive polymer b), at least one fluorinated compound c), at least one polymeric anion d), wherein the at least one polymeric anion d) comprises a copolymer. Further, the invention relates to a process for the production of the composition, to a layered structure comprising the composition, to a process for the production of the layered structure, to a device, especially an OLED, comprising the layered structure and to a use of the composition in a layered structure.

Conductive polymers are increasingly gaining in economic importance, since polymers offer advantages over metals with regard to processability, weight and the selective adjustment of properties by means of chemical modification. Examples of known π-conjugated polymers are polypyrroles, polythiophenes, polyanilines, polyacetylenes, polyphenylenes and poly(p-phenylene vinylenes). Layers of conductive polymers are widely used technically, for example as polymeric counter-electrodes in capacitors or for throughhole plating in printed circuit boards. Conductive polymers are produced by chemical or electrochemical oxidation from monomeric precursors, such as for example from optionally substituted thiophenes, pyrroles and anilines and optionally oligomeric derivatives thereof. Chemical oxidative polymerisation in particular is widespread, since it is technically simple to carry out in a liquid medium or on diverse substrates.

A particularly important polythiophene used technically is poly(ethylene-3,4-dioxythiophene) (PEDOT or PEDT) as described for example in EP 0 339 340 A2, which is produced by chemical polymerisation of ethylene-3,4-dioxythiophene (EDOT or EDT) and which in its oxidised form exhibits very high conductivity values. A survey of numerous poly(alkylene-3,4-dioxythiophene) derivatives, in particular poly(ethylene-3,4-dioxythiophene) derivatives, their monomer units, syntheses and applications is provided by L. Groenendaal, F. Jonas, D. Freitag, H. Pielartzik & J. R. Reynolds, Adv. Mater. 12, (2000) p. 481-494.

Dispersions of PEDOT with polyanions, such as for example polystyrene sulphonic acid (PSS), as disclosed for example in EP 0 440 957 A2, have acquired particular importance in industry. These dispersions can be used to produce transparent, conductive films which have found numerous applications, for example as an antistatic coating or as a hole-injection layer in organic light-emitting diodes (OLEDs), as shown in EP 1 227 529 A2.

The polymerisation of EDOT takes place in an aqueous solution of the polyanion to form a polyelectrolyte complex. Cationic polythiophenes, which for the purposes of charge compensation comprise polymeric anions as counterions, are often also referred to by experts as polythiophene/polyanion complexes. By virtue of the polyelectrolyte properties of PEDOT as a polycation and PSS as a polyanion this complex is not a true solution but rather a dispersion. The extent to which polymers or portions of polymers are dissolved or dispersed is dependent on the mass ratio of the polycation and the polyanion, on the charge density of the polymers, on the salt concentration of the environment and on the nature of the surrounding medium (V. Kabanov, Russian Chemical Reviews 74, 2005, 3-20).

As described above, complexes of PEDOT and PSS have found a wide variety of applications. However, the disadvantage of using PSS as the polyanion is that it is soluble in water and in water-miscible organic solvents, for instance in lower alcohols such as ethanol or methanol, but not in water-immiscible organic solvents. The dispersing of conductive polymers such as PEDOT in water-immiscible solvents is however desirable in some cases, since firstly such solvents can be removed comparatively easily by evaporation and such solvent systems are distinguished by particularly good film-forming properties. Secondly, dispersions comprising PEDOT are frequently used in combination with paint systems, which however are often based on water-immiscible solvents or solvent systems.

Moreover, aqueous PEDOT/PSS dispersions have the disadvantage that the efficiency and the lifetime of OLEDs with hole-injection layers produced from these dispersions is often insufficient. In particular when PEDOT/PSS dispersions are used to produce hole-injection layers in OLEDs the luminance of the OLEDs decreases comparatively quickly in some circumstances.

WO 2012/059215 A1 discloses compositions comprising a water-immiscible organic solvent and complexes that are based on a polythiophene and a sulphonated synthetic rubber. These non-aqueous compositions can be used for the formation of a hole-injection layer in an OLED. The lifetime of such OLEDs is significantly larger than the lifetime of OLEDs the hole-injection layer has been prepared by means of aqueous PEDOT/PSS-dispersions as disclosed in EP 1 227 529 A2. However, there is still a need to further improve the lifetime as well as the efficiency of OLEDs the hole-injection layer of which is based on conductive polymers such as polythiophenes.

It was therefore an object of the present invention to overcome at least one of the disadvantages of the prior art in the field of organic electronic devices, in particular of OLEDs the hole injection layer of which is based on conductive polymers such as PEDOT, or of solar cells comprising conductive polymer layers.

In particular, it was an object of the present invention to provide a composition comprising electrically conductive polymers such as PEDOT that is basically free of water and that can be used to prepare a hole-injection layer in an OLED or an electrically conductive layer in a solar cell and that, compared to the compositions known form the prior art, helps to improve the performance, in particular the life-time and the efficiency of these devices.

It was also an object of the present invention to provide a process for the production of such a composition.

A contribution to the solution of at least one of the above objects is provided by the subject matter of the category-forming independent claims, wherein the therefrom dependent sub-claims represent preferred embodiments of the present invention, whose subject matter likewise make a contribution to solving at least one object.

EMBODIMENTS

|1| A composition comprising:
   a) at least one organic solvent;
   b) at least one conductive polymer, preferably a cationic polymer;
   c) at least one fluorinated compound;

d) at least one polymeric anion, wherein the at least one polymeric anion is a copolymer comprising ionic and non-ionic repeating units.

|2| The composition according to embodiment |1|, wherein the number of the ionic repeating units is smaller than the number of the non-ionic repeating units.

|3| The composition according to embodiment |1| or |2|, wherein the ionic repeating unit comprises an acidic group, preferably selected from the group consisting of a carboxylate, a sulfate, a sulfonate, a phosphate, a phosphonate or a mixture of at least two thereof, preferably a sulfonate.

|4| The composition according to any of embodiments |1| to |3|, wherein the ionic repeating unit is derived from a monomer selected from the group consisting of acrylate, methacrylate, maleic acrylate, styrenesulphonate, styrenedisulphonate, vinylsulphonate or a combination of at least two thereof, wherein these groups may optionally be substituted.

|5| The composition according to any of embodiments |1| to |4|, wherein the non-ionic repeating unit is derived from a monomer selected from the group consisting of an alkylene group, a cycloalkylene group, an arylene group, an aralkylene group, a siloxane or a combination of at least two thereof.

|6| The composition according to embodiment |5|, wherein the alkylene group is optionally branched and selected from the group consisting of an ethylene group, a propylene group, a butylene group, a pentylene group, a hexylene group, a heptylene group, an octylene group or a combination of at least two thereof.

|7| The composition according to embodiment |5|, wherein the arylene group is optionally substituted and selected from the group consisting of a phenyl ethene group (styrene), a phenyl propene group, a phenyl butene group, a phenyl pentene group or a combination of at least two thereof.

|8| The composition according to any of embodiments |1| to |7|, wherein the copolymer is selected from the group consisting of a statistical copolymer, an alternating copolymer, a di-block copolymer, a multi-block copolymer, a graft copolymer, a gradient copolymer, or a combination of at least two thereof, wherein a block-copolymer is preferred.

|9| The composition according to any of embodiments |1| to |8|, wherein the copolymer has a structure according to the general formula (Ia) or (Ib) or (Ic):

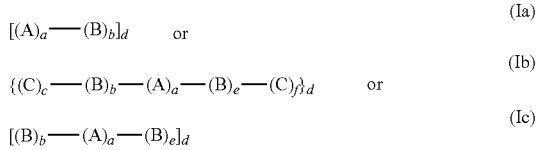

wherein
A represents a ionic repeating unit,
B represents a non-ionic repeating unit,
C represents a further non-ionic unit, which is different from the repeating unit B,
wherein at least one of a, b, c, d, e or f is an integer independently selected from 1 to 100.

|10| The composition according to embodiment |9|, wherein the polymeric anion d) is a hydrogenated styrene block copolymer with at least three blocks A, B and C, according to formula (Ib), wherein, I1. block A corresponds to an at least partially sulphonated polystyrene block;

I2. block B corresponds to a block of hydrogenated cis-polyisoprene with n from 10 to 1000

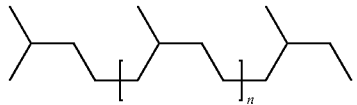

or a block of hydrogenated trans polyisoprene with n from 10 to 1000

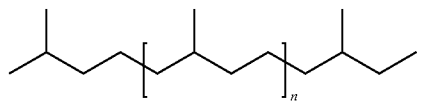

or a mixture thereof;

I3. block C corresponds to a polystyrene block which is at least partially substituted with tert-butyl groups.

|11| The composition according to embodiment |9| or |10|, wherein the polystyrene block representing block C is preferably substituted with tert-butyl group to an extent of 1 to 70%, or preferably to an extent of 5 to 60%, or preferably to an extent of 10 to 50%, based on the amount of phenyl units of the styrene group.

|12| The composition according to any of embodiments |1| to |11|, wherein the copolymer comprises non-ionic repeating units at its ends.

|13| The composition according to any of embodiments |1| to |12|, wherein the polymeric anion d) comprises polymerized sulfonated monomer units and polymerized non-sulfonated monomer units and wherein molar ratio of the non-sulfonated units is at least 5%, preferably at least 20% and most preferably at least 40% in each case based on the total amount of monomer units in the copolymer.

|14| The composition according to embodiment |13|, wherein the polymeric anion d) is a block-copolymer comprising polymerized sulfonated units and polymerized non-sulfonated units and wherein molar ratio of the non-sulfonated units is at least 5%, preferably at least 20% and most preferably at least 40% in each case based on the total amount of monomer units in the copolymer.

|15| The composition according to embodiment |14|, wherein the polymeric anion d) is a block-copolymer comprising polymerized sulfonated polystyrene units and polymerized non-sulfonated units and wherein molar ratio of the non-sulfonated units is at least 5%, preferably at least 20% and most preferably at least 40% in each case based on the total amount of monomer units in the copolymer.

|16| The composition according to any of embodiments |1| to |15|, wherein the polymeric anion d) is a hydrogenated or unhydrogenated, preferably hydrogenated styrene-isoprene block copolymers with the structure C-B-A-B-C, in which the block C corresponds to a polystyrene block which is at least partially substituted with tert-butyl groups.

|17| The composition according to any of embodiments |1| to |16|, wherein the molecular weight of the at least one polymeric anion d) is in the range of from 1,000 to 2,000,000 g/mol, preferably in the range from of 5,000 to 600,000 g/mol, or preferably in the range of from 10,000 to 400,000 g/mol.

|18| The composition according to any of embodiments |1| to |17|, wherein the water content of the composition is not more than 2 wt.-%, preferably not more than 0.5 wt.-%, or preferably not more than 0.3 wt.-%, based on the total weight of the composition.

|19| The composition according to any of embodiments |1| to |18|, wherein the at least one organic solvent a) is selected from the group consisting of an aprotic, a polar, a non-polar and a non-polar, aprotic organic solvent or a mixture of at least two of these.

|20| The composition according to any of embodiments |1| to |19|, wherein the at least one organic solvent a) has a relative permittivity of below 20.

|21| The composition according to any of embodiments |1| to |20|, wherein the at least one organic solvent a) is a mixture of at least two different organic solvents, a first organic solvent a1) and second organic solvent a2).

|22| The composition according to embodiment |21|, wherein the first organic solvent a1) is an aprotic, polar organic solvent or solvent system.

|23| The composition according to any of embodiments |21| or |22|, wherein the second organic solvent a2) is an aprotic, non-polar organic solvent or solvent system.

|24| The composition according to any of to any of embodiments |21| to |24|, wherein the first organic solvent a1) is selected from the group comprising an ether, an ester, a siloxane, a halogenated aromatic hydrocarbon, a perfluorinated solvent or a mixture of at least two thereof.

|25| The composition according to any of embodiments |21| to |24|, wherein the second organic solvent a2) is a mixture of a cyclic organic solvent and a linear organic solvent.

|26| The composition according to any of embodiments |2| to |25|, wherein the ratio of the first organic solvent a1) to the second organic solvent a2) is in the range from 2:1 to 10:1, or preferably in the range from 2.5:1 to 9:1, or preferably in the range from 3:1 to 8:1.

|27| The composition according to any of embodiments |1| to |26|, wherein the composition comprises as the at least one fluorinated compound c) a fluorinated compound having a molecular weight of less than 2,100 g/mol.

|28| The composition according to any of embodiments |1| to |27|, wherein the at least one fluorinated compound c) has a vapor pressure of less than 40 mbar, preferably less than 20 mbar and more preferably less than 10 mbar (in each case determined at a temperature of 100° C.).

|29| The composition according to any of embodiments |1| to |28|, wherein the at least one fluorinated compound c) comprises at least one fluorinated carbon atom.

|30| The composition according to any of embodiments |1| to |29|, wherein the at least one fluorinated compound comprises at least one aliphatic or aromatic residue in which at least 10% of the hydrogen atoms are substituted by fluorine atoms.

|31| The composition according to any of embodiments |1| to |30|, wherein the at least one fluorinated compound c) has a structure according to formula (IIa) or (IIb):

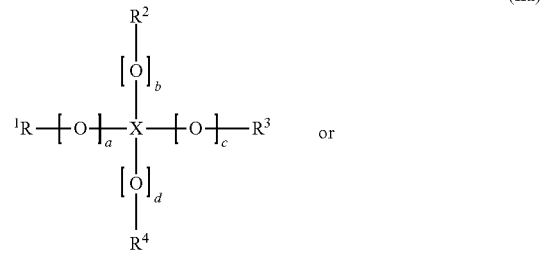

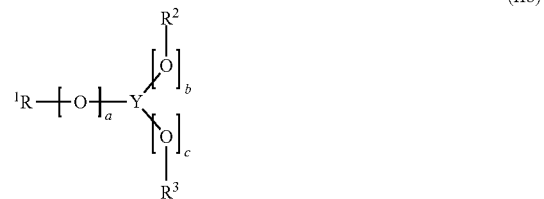

wherein
X is selected from C or Si;
Y is selected from N or P;
$R^1$ is an aliphatic or aromatic residue that comprises at least one F atom;
a, b, c, d can be independently or equally 0 or 1, wherein in the case of Y=N a, b and c are 0;
wherein, if b, c, d are 0, moieties $R^2$, $R^3$, $R^4$ are independently or equally selected from the group consisting of hydrogen, hydroxyl, a hydrocarbon, a halogen, sulphate, —$NH_2$, nitrate, phosphate or a combination of at least two thereof;
wherein if b, c, d are 1, moieties $R^2$, $R^3$, $R^4$ are independently or equally selected from the group consisting of hydrogen, a hydrocarbon, or a combination of at least two thereof.

|32| The composition according to embodiment |31|, wherein a is 0 and b, c, d are 1.

|33| The composition according to embodiment |32|, wherein moieties $R^2$, $R^3$ and $R^4$ are a $C_1$-$C_5$-alkyl group, preferably a methyl group or a ethyl group and moiety $R^1$ is an optionally branched alkyl group selected from the group consisting of —$C_1H_2F_1$, —$C_1H_1F_2$, —$C_2H_4F_1$, —$C_2H_3F_2$, —$C_2H_2F_3$, —$C_3H_6F_1$, —$C_3H_5F_2$, —$C_3H_4F_3$, —$C_3H_3F_4$, —$C_3H_2F_5$, —$C_4H_8F_1$, —$C_4H_7F_2$, —$C_4H_6F_3$, —$C_4H_5F_4$, —$C_4H_4F_5$, —$C_4H_3F_6$, —$C_4H_2F_7$, —$C_5H_1F_1$, $C_5H_9F_2$, $C_5H_8F_3$, $C_5H_7F_4$, $C_5H_6F_5$, $C_5H_5F_6$, $C_5H_4F_7$, $C_5H_3F_8$, $C_5H_2F_9$, $C_6H_{12}F_1$, $C_6H_{11}F_2$, $C_6H_{10}F_3$, $C_6H_9F_4$, $C_6H_8F_5$, $C_6H_7F_6$, $C_6H_6F_7$, $C_6H_5F_8$, $C_6H_4F_9$, $C_6H_3F_{10}$, $C_6H_2F_{11}$, $C_7H_{14}F_1$, $C_7H_{13}F_2$, $C_7H_{12}F_3$, $C_7H_{11}F_4$, $C_7H_{10}F_5$, $C_7H_9F_6$, $C_7H_8F_7$, $C_7H_7F_8$, $C_7H_6F_9$, $C_7H_5F_{10}$, $C_7H_4F_{11}$, $C_7H_3F_{12}$, $C_7H_2F_{13}$, $C_8H_{16}F_1$, $C_8H_{15}F_2$, $C_8H_{14}F_3$, $C_8H_{13}F_4$, $C_8H_{12}F_5$, $C_8H_{11}F_6$, $C_8H_{10}F_7$, $C_8H_9F_8$, $C_8H_8F_9$, $C_8H_7F_{10}$, $C_8H_6F_{11}$, $C_8H_5F_{12}$, $C_8H_4F_{13}$, $C_8H_3F_{14}$, $C_8H_2F_{15}$, $C_9H_{18}F_1$, $C_9H_{17}F_2$, $C_9H_{16}F_3$, $C_9H_{15}F_4$, $C_9H_{14}F_5$, $C_9H_{13}F_6$, $C_9H_{12}F_7$, $C_9H_{11}F_8$, $C_9H_{10}F_9$, $C_9H_9F_{10}$, $C_9H_8F_{11}$, $C_9H_7F_{12}$, $C_9H_6F_{13}$, $C_9H_5F_{14}$, $C_9H_4F_{15}$, $C_9H_3F_{16}$, $C_9H_2F_{17}$, $C_{10}H_{20}F_1$, $C_{10}H_{19}F_2$, $C_{10}H_{18}F_3$, $C_{10}H_{17}F_4$, $C_{10}H_{16}F_5$, $C_{10}H_{15}F_6$, $C_{10}H_{14}F_7$, $C_{10}H_{13}F_8$, $C_{10}H_2F_9$, $C_{10}H_{11}F_{10}$, $C_{10}H_{10}F_{11}$, $C_{10}H_9F_{12}$, $C_{10}H_8F_{13}$, $C_{10}H_7F_{14}$, $C_{10}H_6F_{15}$, $C_{10}H_5F_{16}$, $C_{10}H_4F_{17}$, $C_{10}H_3F_{18}$, $C_{10}H_2F_{19}$.

|34| The composition according to any of the preceding embodiments |1| to |33|, wherein the at least one fluorinated compound c) is a nonionic compound.

|35| The composition according to any of embodiments |1| to |34|, wherein the at least one fluorinated compound c) has a molecular weight of less than 2,100 g/mol, preferably less than 1,600 g/mol and even more preferably less than 1,000 g/mol.

|35| The composition according to embodiment |35|, wherein the fluorinated compound c) comprises 2 to 20 fluorine atoms, preferably 2 to 15 fluorine atoms and even more preferably 3 to 10 fluorine atoms.

|36| The composition according to any of embodiments |1| to |34|, wherein the at least one fluorinated compound c) has a molecular weight of more than 5,000 g/mol, preferably or more than 10,000 g/mol and more preferably more than 50,000 g/mol.

|38| The composition according to embodiment |37|, wherein the fluorinated compound c) comprises more than 20 fluorine atoms, preferably more than 40 fluorine atoms and more preferably more than 60 fluorine atoms.

|39| The composition according to any of the preceding embodiments |1| to |38|, wherein the at least one conductive polymer b) is a polythiophene.

|40| The composition according to the preceding embodiment |39|, wherein the polythiophene and the at least one polymeric anion d) are present in the form of a polythiophene:polymeric anion-complex.

|41| The composition according to any of the preceding embodiments |1| to |40|, wherein the at least one conductive polymer b) is poly(3,4-ethylenedioxythiophene).

|42| The composition according to any of the preceding embodiments |1| to |41|, wherein the composition provides at least one of the following properties:
  a. a viscosity in the range from 0.1 and 1,000 mPa·s, preferably in the range of from 0.5 to 800 mPa·s and more preferably in the range of from 1 to 500 mPa·s;
  b. a water content of not more than 2 wt.-%. preferably not more than 0.5 wt.-% and more preferably not more than 0.3 wt.-%;
  c. particles of the composition having a particle diameter ($d_{50}$) of 700 nm or less, preferably of 600 nm or less and more preferably of 500 nm or less.

|43| The composition according to any of the preceding embodiments |1| to |42|, wherein the composition comprises:
  a) 70 to 99.5 wt.-% of the at least one organic solvent;
  b) 0.05 to 4 wt.-% of the at least one conductive polymer;
  c) 0.05 to 10 wt.-% of at least one fluorinated compound;
  d) 0.05 to 13 wt.-% of at least one polymeric anion;
  e) 0 to 6 wt.-% of at least one further additive;
  wherein the sum of the components a) to e) is 100 wt.-%.

|44| A layered structure comprising the following layers:
  i. a substrate with a first surface,
  ii. a first layer superimposing at least on a part of the substrate surface;
    wherein the first layer comprises:
      b) at least one conductive polymer;
      c) at least one fluorinated compound;
      d) at least one polymeric anion, wherein the at least one polymeric anion is a copolymer comprising ionic and non-ionic repeating units.

|45| The layered structure according to embodiment |44|, wherein the polymeric anion d) is as defined in embodiments |2| to |17|.

|46| The layered structure according to embodiment |44| or |45|, wherein the fluorinated compound c) is as defined in embodiments |27| to |38|.

|47| The layered structure according to any one of embodiments |44| to |46|, wherein the conductive polymer b) is as defined in embodiments |39| to |41|.

|48| The layered structure according to any one of embodiments |44| to |48|, wherein the organic solvent a) is as defined in embodiments |19| to |26|.

|49| A process for the production of a layered structure, comprising the process steps:
  I) providing of a substrate with a first surface;
  II) superimposing the substrate at least partially on its first surface by a composition according to one of embodiments |1| to |43|;
  III) at least partial removal of the at least one organic solvent a) from the composition, thereby obtaining an electrically conductive layer superimposed on the substrate.

|50| A layered structure obtainable according to the process according to embodiment |49|.

|51| A device comprising a layered structure according to any of embodiments |44| to |48| or |50|.

|52| The device according to embodiment |51|, wherein the device is selected from the group consisting of an OLED, a display, an organic solar cell, a hybrid solar cell, a field effect transistor, a touchscreen or a thermoelectric generator or a combination of at least a two thereof.

|53| Use of a composition according to any of embodiments |1| to |43| for the preparation of an electrically conductive layer in a device as defined embodiment |52|.

|54| Use of the composition according to any of embodiments |1| to |43| for the preparation of a hole-injection layer of an OLED.

The invention relates to a composition comprising:
a) at least one organic solvent;
b) at least one conductive polymer, preferably a cationic polymer;
c) at least one fluorinated compound;
d) at least one polymeric anion, wherein the at least one polymeric anion is a copolymer comprising ionic and non-ionic repeating units.

The composition according to the present invention is preferably a liquid composition, wherein the composition, depending on the chemical nature and the relative amount of the components comprised therein, can be a solution, a dispersion or an emulsion.

Organic Solvent a)

According to a preferred embodiment of the composition the at least one organic solvent a) is selected from the group consisting of an aprotic, a polar, a non-polar and a non-polar, aprotic organic solvent or a mixture of at least two of these.

Preferably, the at least one organic solvent a) has a relative permittivity of below 20, preferably below 15 and most preferably below 10. Permittivity values for solvents can be found in standard handbooks such as "Handbook of Chemistry and Physics", 95th Edition, 2014, CRC press, ISBN 9781482208672

Suitable organic solvents a) are
  aromatic hydrocarbons such as benzene, toluene, xylene, mesitylene or biphenyl,
  halogenated aromatic hydrocarbons such as fluorobenzene, chlorobenzene, bromobenzene, iodobenzene, 2-chlorotoluene, 3-chlorotoluene, 4-chlorotoluene, 1,3-dichlorobenzene, 1,4-dichlorobenzene, 1,2-dichlorobenzene, 1,3,5-trichlorobenzene, 1,2,4-trichlorobenzene or 1,2,3-trichlorobenzene;
  perfluorinated solvents, in particular perfluorinated alkanes, alkanes, ethers, arenes, alkarenes, aralkanes, alkenes, and alkynes, perfluorinated aromatic compounds, perfluorinated ethers or perfluorinated amines;
ethers such as diethylether, diisopropylether, methyltert-butylether dibutylether, diphenylether, anisole and ethylenglycol ethers such as polyethylenglycol (PEG), diethylene glycol monomethyl ether, diethylene glycol monoethyl ether, ethylene glycol dimethyl ether, ethylene glycol diethyl ether, propylen glycol monopropyl ether, dipropylen glycol monomethylether, dipropylen glycol dimethylether, diethylene glycol monomethyl ether or ethylene glycol dibutyl ether;
siloxanes such as hexamethyldisiloxane, octamethyldisiloxane, decamethyldisiloxane, oligomethyldisiloxane, decamethyltetrasiloxane, dodecamethylpentasiloxane, polymethyldisiloxane, polysiloxane, or derivatives thereof;
esters such as methylacetate, ethylacetate, propylacetate or butylacetate, methylbenzoate, ethylbenzoate, propylbenzoate, butylbenzoate, γ-butyrolactone, γ-valerolactone, γ-valerolactone, ethylene glycol methyl ether acetate, ethylene glycol monoethyl ether acetate, ethylene glycol monobutyl ether acetate, propylene glycol methyl ether acetate
or mixtures of at least two thereof.

Preferably, the composition according to the present invention comprises two or more organic solvents a), in particular a solvent mixture comprising two different kinds of organic solvents, i. e. a first solvent a1) and a second solvent a2). Preferably, the first organic solvent a1) is an aprotic, polar organic solvent or solvent system. Preferably, the second organic solvent a2) is an aprotic, non-polar organic solvent or solvent system. Preferably, the first organic solvent a1) is selected from the group comprising an ether (preferably one of the ethers mentioned above), an ester (preferably one of the esters mentioned above), a siloxane (preferably one of the siloxanes mentioned above), a halogenated aromatic hydrocarbon (preferably one of the halogenated aromatic hydrocarbons mentioned above), a perfluorinated solvent (preferably one of the a perfluorinated solvents mentioned above), or a combination of at least two thereof. Preferably, the second organic solvent a2) is a mixture of a cyclic organic solvent, preferably a cyclic hydrocarbon such as cyclohexane, and a linear organic solvent, preferably a linear hydrocarbon such as heptane. Preferably, the weight ratio of the cyclic organic solvent to the linear organic solvent is in the range of from 0.5:1.5 to 1.5:0.5, preferably in the range of from 0.6:1.4 to 1.4:0.6 and more preferably in the range of from 0.7:1.3 to 1.3:0.7. In this context it is also preferred that the weight ratio of the first organic solvent a1) to the second organic solvent a2) is in the range from 2:1 to 10:1, or preferably in the range from 2.5:1 to 9:1, or preferably in the range from 3:1 to 8:1. The weight ratio of the first organic solvent a1) to the cyclic organic solvent and the linear organic solvent is in the range from 5:1:1 to 20:1:1, or preferably in the range from 7:1:1 to 15:1:1.

Preferably, the composition comprises the at least one organic solvent a) in an amount of from 70 to 99.5 wt.-%, or preferably in an amount of from 75 to 99 wt.-%, or preferably in an amount of from 80 to 97.5 wt.-%, in each case based on the total weight of the composition. In the case of a solvent mixture of two or more organic solvents these amounts refer to the total amount of organic solvent.

Conductive Polymer b)

As a conductive polymer b) conjugated polymers such as polypyrroles, polythiophenes, polyanilines, polyacetylenes or polyphenylenes can be used. Preferably, the at least one conductive polymer b) comprises polythiophene.

According to a preferred embodiment of the composition according to the present invention the at least one conductive polymer b) therefore comprises a polythiophene. Preferred polythiophenes are those having repeating units of the general formula (III) or (IV) or a combination of units of the general formulas (III) and (IV), preferably a polythiophene with repeating units of the general formula (IV):

(III)

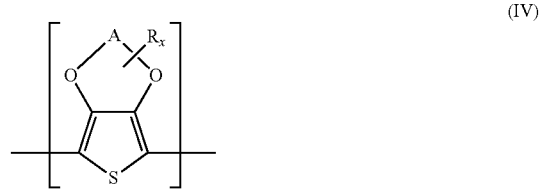

(IV)

wherein
A represents an optionally substituted $C_1$-$C_5$-alkylene radical,
R represents a linear or branched, optionally substituted $C_1$-$C_{18}$-aliphatic or heteroaliphatic radical, an optionally substituted $C_5$-$C_{12}$-cycloaliphatic or cycloheteroaliphatic alkyl radical, an optionally substituted $C_6$-$C_{14}$-aryl or heteroaryl radical, an optionally substituted $C_7$-$C_{18}$-aralkyl or heteroaralkyl radical, an optionally substituted $C_1$-$C_4$-hydroxyaliphatic or hydroxyheteroalphatic radical or a hydroxyl radical,
x represents an integer from 0 to 8 and
in the case where several radicals R are bonded to A, these can be identical or different.

The general formulae (III) and (IV) are to be understood as meaning that x substituents R can be bonded to the alkylene radical A.

Polythiophenes having recurring units of the general formula (IV) wherein A represents an optionally substituted $C_2$-$C_3$-alkylene radical and x represents 0 or 1 are particularly preferred.

In the context of the invention, the prefix "poly" is to be understood as meaning that the polymer or polythiophene comprises more than one identical or different recurring unit of the general formulae (III) and (IV). In addition to the recurring units of the general formulae (III) and/or (IV), the polythiophenes can optionally also comprise other recurring units, but it is preferable for at least 50%, particularly preferably at least 75% and most preferably at least 95% of all the recurring units of the polythiophene to have the general formula (III) and/or (IV), preferably the general formula (IV). The percentage figures stated above are intended here to express the numerical content of the units of the structural formula (III) and (IV) in the total number of monomer units in the foreign-doped conductive polymer. The polythiophenes comprise a total of n recurring units of the general formula (III) and/or (IV), preferably of the general formula (IV), wherein n is an integer from 2 to 2,000, preferably 2 to 100. The recurring units of the general formula (III) and/or (IV), preferably of the general formula (IV), can in each case be identical or different within a polythiophene. Polythiophenes having in each case identical recurring units of the general formula (IV) are preferred.

Preferably at least 50%, particularly preferably at least 75%, still more preferably at least 95% and most preferably 100% of all the recurring units of the polythiophene are 3,4-ethylenedioxythiophene units.

According to a particularly preferred embodiment of the composition according to the present invention the at least one conductive polymer b) therefore is poly(3,4-ethylenedioxythiophene).

The polythiophenes preferably in each case carry H on the end groups.

In the context of the invention, $C_1$-$C_5$-alkylene radicals A are preferably methylene, ethylene, n-propylene, n-butylene or n-pentylene. $C_1$-$C_{18}$-Alkyl radicals R preferably represent linear or branched $C_1$-$C_{18}$-alkyl radicals, such as methyl, ethyl, n- or iso-propyl, n-, iso-, sec- or tert-butyl, n-pentyl, 1-methylbutyl, 2-methylbutyl, 3-methylbutyl, 1-ethylpropyl, 1,1-dimethylpropyl, 1,2-dimethylpropyl, 2,2-dimethylpropyl, n-hexyl, n-heptyl, n-octyl, 2-ethylhexyl, n-nonyl, n-decyl, n-undecyl, n-dodecyl, n-tridecyl, n-tetradecyl, n-hexadecyl or noctadecyl, $C_5$-$C_{12}$-cycloalkyl radicals R represent, for example, cyclopentyl, cyclohexyl, cycloheptyl, cyclooctyl, cyclononyl or cyclodecyl, $C_5$-$C_{14}$-aryl radicals R represent, for example, phenyl or naphthyl, and $C_7$-$C_{18}$-aralkyl radicals R represent, for example, benzyl, o-, m-, p-Tolyl, 2,3-, 2,4-, 2,5-, 2,6-, 3,4-, 3,5-xylyl or mesityl. The preceding list serves to illustrate the invention by way of example and is not to be considered conclusive.

In the context of the invention, numerous organic groups are possible as optionally further substituents of the radicals A and/or of the radicals R of formulas (III) or (IV), for example alkyl, cycloalkyl, aryl, aralkyl, alkoxy, halogen, ether, thioether, disulphide, sulphoxide, sulphone, sulphonate, amino, aldehyde, keto, carboxylic acid ester, carboxylic acid, carbonate, carboxylate, cyano, alkylsilane and alkoxysilane groups and carboxamide groups.

The polythiophenes are preferably cationic, "cationic" relating only to the charges on the polythiophene main chain. The positive charges are not shown in the formulae, since their precise number and position cannot be determined absolutely. However, the number of positive charges is at least 1 and at most n, where n is the total number of all recurring units (identical or different) within the polythiophene.

To compensate the positive charge, the cationic polythiophenes require anions as counter-ions. It is preferable in this connection for the at least one conductive polymer b) in the composition to comprise a cationic polythiophene, which is present in the form of a salt or a complex of the cationic polythiophene and a counter-ion, preferably in the form of a salt or a complex of a poly(3,4-alkylenedioxythiophene) and a counter-ion, wherein monomeric and at least one polymeric anion d) can be used as the counter-ions. According to the most preferred embodiment of the composition according to the present invention the polymeric anion d) as described in more detail later is the counter-ion for the cationic polythiophene and the cationic polythiophene and the polymeric anion d) are present in the form of a polythiophene:polymeric anion-complex.

Preferably, the composition comprises the at least one conductive polymer b) in an amount of from 0.1 to 4 wt.-%, or preferably 0.2 to 3.9 wt.-%, or preferably 0.5 to 3.5 wt.-%, based on the total weight of the composition. If the composition comprises two or more conductive polymer b), these amounts refer to the total amount of conductive polymers.

Fluorinated Compound c)

The composition according to the invention comprises at least one fluorinated compound c). The composition may comprise more than one fluorinated compound, but it is also possible two add two or more different fluorinated compounds. According to the invention, if the phrase "fluorinated compound" is used, the sum of all fluorinated compounds is meant.

In the context of the invention, a fluorinated compound is any compound with at least one carbon atom which is bound to an F atom, also called a fluorinated carbon. Preferably, the at least one fluorinated compound c) comprises F atoms in the range from 2 to 20, or preferably in the range from 3 to 18, or preferably in the range from 5 to 15. Preferably, the fluorinated carbons are bound to each other. Preferably, the fluorinated carbons are at one end of the at least one fluorinated compound c). Preferably, the at least one fluorinated compound c) comprises at least one carbon atom which is not a fluorinated carbon. Preferably, the at least one fluorinated compound c) comprises at least one aliphatic or aromatic residue in which at least 10%, preferably at least 25% even more preferably at least 50% of the hydrogen atoms are substituted by fluorine atoms.

According to a first particular embodiment of the composition according to the present invention the at least one fluorinated compound c) has a molecular weight of less than 2,100 g/mol, preferably less than 1,600 g/mol and even more preferably less than 1,000 g/mol. In context with this first particular embodiment of the composition according to the present invention it is also preferred that such a low-molecular weight fluorinated compound c) comprises 2 to 20 fluorine atoms, preferably 2 to 15 fluorine atoms and even more preferably 3 to 10 fluorine atoms.

According to a second particular embodiment of the composition according to the present invention the at least one fluorinated compound c) has a molecular weight of more than 5,000 g/mol, preferably or more than 10,000 g/mol and more preferably more than 50,000 g/mol. In context with this second particular embodiment of the composition according to the present invention it is also preferred that such a high-molecular weight fluorinated compound c) comprises more than 20 fluorine atoms, preferably more than 40 fluorine atoms and more preferably more than 60 fluorine atoms.

The at least one fluorinated compound c) preferably has a vapor pressure of less than 40 mbar, preferably less than 20 mbar and more preferably less than 10 mbar (in each case determined at a temperature of 100° C.). It is furthermore preferred that the at least one fluorinated compound c) is soluble in an organic solvent having a permittivity value of less than 20, preferably in methyl-tert.-butylether (also known as MTBE). "Soluble" in this context means that at least 0.05 g, preferably at least 0.1 g and more preferably at least 0.5 g of the at least one fluorinated compound c) is soluble in the organic solvent having a permittivity value of less than 20, preferably in methyl-tert.-butylether.

It is furthermore preferred that the fluorinated compound c) is a non-ionic compound.

According to a particular embodiment of the composition according to the present invention the at least one fluorinated compound c) has a structure according to formula (IIa) or (IIb):

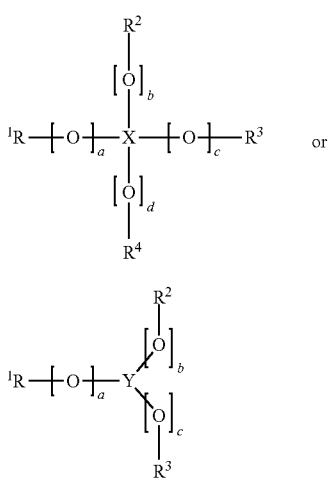

(IIa)

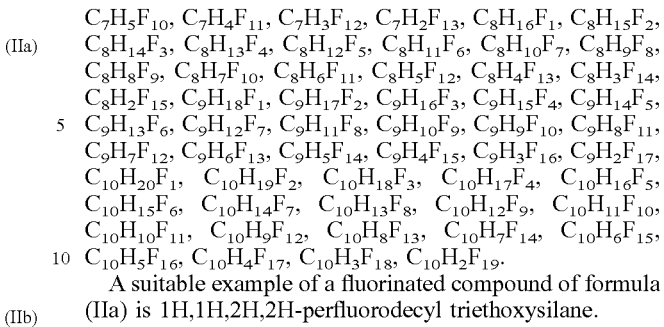

(IIb)

wherein
X is selected from C or Si;
Y is selected from N or P;
$R^1$ is an aliphatic or aromatic residue that comprises at least one F atom;
a, b, c, d can be independently or equally 0 or 1, wherein in the case of Y=N a, b and c are 0;
wherein, if b, c, d are 0, moieties $R^2$, $R^3$, $R^4$ are independently or equally selected from the group consisting of hydrogen, hydroxyl, a hydrocarbon, a halogen, sulphate, $-NH_2$, nitrate, phosphate or a combination of at least two thereof;
wherein if b, c, d are 1, moieties $R^2$, $R^3$, $R^4$ are independently or equally selected from the group consisting of hydrogen, a hydrocarbon, or a combination of at least two thereof.

In this context it is particularly preferred that the fluorinated compound is a mono-, di- or trialkoxysilane, in which at least one fluorinated aliphatic or a fluorinated aromatic group is bond to the Si atom. Referring to formula (IIa), moiety $R^1$ is preferably a linear alkyl group with at least one F atom. Preferably, the linear alkyl group comprises carbon atoms in the range from of 6 to 12. Preferably, at least half of the carbon atoms of the moiety $R^1$ are fluorinated carbons. Preferably, $R^1$, $R^2$, $R^3$ and $R^4$ comprise linear hydrocarbons. Further referring to formula (IIa) or (IIb), preferably $R^1$ is an aliphatic or an aromatic group in which at least 10%, preferably at least 25%, more preferably at least 50% of the hydrogen atoms are substituted by fluorine atoms of the hydrogen atoms are substituted by an F atom. Preferably, $R^1$ is a $C_1$-$C_{18}$ alkyl group in which at least 10% of the hydrogen atoms are substituted by fluorine atoms.

According to a preferred embodiment of the fluorinated compound having structure (IIa) a is 0 and b, c and d are 1. In this context it is particularly preferred that moieties $R^2$, $R^3$ and $R^4$ are a $C_1$-$C_5$-alkyl group, preferably a methyl group or a ethyl group and moiety $R^1$ is an optionally branched alkyl group selected from the group consisting of —$C_1H_2F_1$, —$C_1H_1F_2$, —$C_2H_4F_1$, —$C_2H_3F_2$, —$C_2H_2F_3$, —$C_3H_6F_1$, —$C_3H_5F_2$, —$C_3H_4F_3$, —$C_3H_3F_4$, —$C_3H_2F_5$, —$C_4H_8F_1$, —$C_4H_7F_2$, —$C_4H_6F_3$, —$C_4H_5F_4$, —$C_4H_4F_5$, —$C_4H_3F_6$, —$C_4H_2F_7$, —$C_5H_{10}F_1$, $C_5H_9F_2$, $C_5H_8F_3$, $C_5H_7F_4$, $C_5H_6F_5$, $C_5H_5F_6$, $C_5H_4F_7$, $C_5H_3F_8$, $C_5H_2F_9$, $C_6H_{12}F_1$, $C_6H_{11}F_2$, $C_6H_{10}F_3$, $C_6H_9F_4$, $C_6H_8F_5$, $C_6H_7F_6$, $C_6H_6F_7$, $C_6H_5F_8$, $C_6H_4F_9$, $C_6H_3F_{10}$, $C_6H_2F_{11}$, $C_7H_{14}F_1$, $C_7H_{13}F_2$, $C_7H_{12}F_3$, $C_7H_{11}F_4$, $C_7H_{10}F_5$, $C_7H_9F_6$, $C_7H_8F_7$, $C_7H_7F_8$, $C_7H_6F_9$, $C_7H_5F_{10}$, $C_7H_4F_{11}$, $C_7H_3F_{12}$, $C_7H_2F_{13}$, $C_8H_{16}F_1$, $C_8H_{15}F_2$, $C_8H_{14}F_3$, $C_8H_{13}F_4$, $C_8H_{12}F_5$, $C_8H_{11}F_6$, $C_8H_{10}F_7$, $C_8H_9F_8$, $C_8H_8F_9$, $C_8H_7F_{10}$, $C_8H_6F_{11}$, $C_8H_5F_{12}$, $C_8H_4F_{13}$, $C_8H_3F_{14}$, $C_8H_2F_{15}$, $C_9H_{18}F_1$, $C_9H_{17}F_2$, $C_9H_{16}F_3$, $C_9H_{15}F_4$, $C_9H_{14}F_5$, $C_9H_{13}F_6$, $C_9H_{12}F_7$, $C_9H_{11}F_8$, $C_9H_{10}F_9$, $C_9H_9F_{10}$, $C_9H_8F_{11}$, $C_9H_7F_{12}$, $C_9H_6F_{13}$, $C_9H_5F_{14}$, $C_9H_4F_{15}$, $C_9H_3F_{16}$, $C_9H_2F_{17}$, $C_{10}H_{20}F_1$, $C_{10}H_{19}F_2$, $C_{10}H_{18}F_3$, $C_{10}H_{17}F_4$, $C_{10}H_{16}F_5$, $C_{10}H_{15}F_6$, $C_{10}H_{14}F_7$, $C_{10}H_{13}F_8$, $C_{10}H_{12}F_9$, $C_{10}H_{11}F_{10}$, $C_{10}H_{10}F_{11}$, $C_{10}H_9F_{12}$, $C_{10}H_8F_{13}$, $C_{10}H_7F_{14}$, $C_{10}H_6F_{15}$, $C_{10}H_5F_{16}$, $C_{10}H_4F_{17}$, $C_{10}H_3F_{18}$, $C_{10}H_2F_{19}$.

A suitable example of a fluorinated compound of formula (IIa) is 1H,1H,2H,2H-perfluorodecyl triethoxysilane.

According to a further embodiment of the compostions according to the present invention the at least one fluorinated compound c) is a polymeric fluorinated compound. Suitable polymeric fluorinated compounds are homopolymers comprising fluorinated monomer units or copolymers comprising fluorinated and non-fluorinated monomer units, wherein these homo- or copolymers preferably have a molecular weight of more than 5,000 g/mol, preferably or more than 10,000 g/mol and more preferably more than 50,000 g/mol. In these high-molecular weight compounds it is furthermore preferred that at least 10%, more preferably at least 20% and even more preferably at least 40% of the hydrogen atoms are substituted by fluorine atoms. As examples of monomers on which the fluorinated homo- or copolymers can be based the following monomers can be mentioned: fluoroalkyl (meth)acrylate, fluoroalkylsulfoamidoethyl (meth)acrylate, fluoroalkylamidoethyl (meth)-acrylate, fluoroalkyl (meth)acrylamide, fluoroalkylpropyl (meth)acrylate, fluoroalkylethyl poly(alkyleneoxide) (meth)acrylate, fluoroalkylsulfoethyl (meth)acrylate, fluoroalkylethyl vinyl ether, fluoroalkylethyl poly(ethyleneoxide) vinyl ether; pentafluoro styrene, fluoroalkyl styrene, fluorinated α-olefins, perfluorobutadiene, 1-fluoroalkylperfluorobutadiene, αH,αH,ωH,ωH-perfluoroalkanediol di(meth)acrylate and β-substituted fluoroalkyl (meth)-acrylate. According to a particularly preferred embodiment of the composition according to the present invention in which the at least one fluorinated compound c) is a fluorinated polymeric compound, the fluorinated polymeric compound is a polymeric fluorinated aromatic compound. Particularly suitable as a polymeric fluorinated aromatic compounds are polypentafluorostyrene or pentafluorostyrene/tert.butylstyrene-copolymers, for example those having a pentafluorostyrene/tert.-butylstyrene ratio of 90:10.

Preferably, the composition comprises the at least one fluorinated compound c) in an amount in the range of from 0.05 to 10 wt.-%, or preferably in the range of from 0.2 to 9 wt.-%, or preferably in the range of from 0.5 to 8 wt.-%, based on the total weight of the composition. If the composition comprises two or more fluorinated compounds, these amounts refer to the total amount of fluorinated compounds.

Polymeric Anion d)

As component d) the composition according to the present invention comprises a polymeric anion, wherein the at least one polymeric anion is a copolymer comprising ionic and non-ionic repeating units. The copolymer can be selected from the group consisting of a statistical copolymer, an alternating copolymer, a di-block copolymer, a multi-block copolymer, a graft copolymer, a gradient copolymer, or a combination of at least two thereof, wherein a block-copolymer is particularly preferred.

Preferably, the number and the arrangement of the ionic and the non-ionic repeating units of the copolymer is not limited as far as the function of the at least one polymeric anion d) building the counter part to the at least one conductive polymer b) is ensured. The copolymer preferably comprises at least one ionic repeating unit and at least two non-ionic repeating units. The ionic repeating units and the non-ionic repeating units can be distributed over the copolymer randomly or uniformly. Varying arrangements of different ionic repeating units and nonionic repeating units are possible in the copolymer. For example, the copolymer can has a structure according to the general formula (Ia) or (Ib) or (Ic):

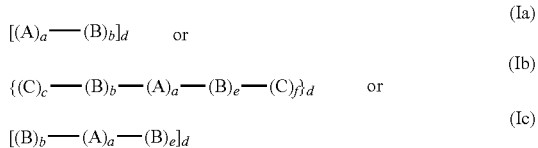

wherein
A represents a ionic repeating unit,
B represents a non-ionic repeating unit,
C represents a further non-ionic unit, which is different from the repeating unit B,
wherein at least one of a, b, c, d, e or f is an integer independently selected from 1 to 100.

Formula (Ia) shows one possible arrangement of ionic repeating units A and non-ionic repeating units B, wherein in the structure of the copolymer the ionic repeating unit A and the non-ionic repeating unit B can each be present in varying numbers at different sections of the polymer strand. An alternative to the structure of formula (Ia) is the structure of formula (Ib), where B and C represent different types of ionic repeating units, or the structure of formula (Ic). Preferably, the digit d in formula (Ib) is 1. Preferably, the digits a and d in formula (Ib) are 1. Preferably, the digits a, b, c and d of formula (Ib) are 1. Preferably, the digit d in formula (Ia) is 1. Preferably, the digits a and d in formula (Ia) are 1. Preferably, the digits a, b and d of formula (Ia) are 1. Preferably, the digit d in formula (Ic) is 1. Preferably, the digits a and d in formula (Ic) are 1. Preferably, the digits a, b, e and d of formula (Ic) are 1. Alternatively, the number of repeating units A, B or C can vary at different positions of the copolymer strand.

Furthermore, the ionic repeating unit in the copolymer may be represented by different kinds of ionic repeating units. The kind of ionic repeating units or non-ionic repeating units may vary at different positions of the copolymer strand. In connection with formula (Ia), A may represent any combination of ionic repeating units and/or B may represent any combination of non-ionic repeating units. In a preferred embodiment of the composition the copolymer comprises at least two different kinds of ionic repeating units, wherein the at least two different kinds of ionic repeating units are distributed randomly over the copolymer strand. In a further preferred embodiment of the composition the copolymer comprises at least two kinds of non-ionic repeating units, wherein the at least two different kinds of non-ionic repeating units are distributed randomly over the copolymer strand. According to a particular embodiment of the polymeric anion d) the copolymer comprises non-ionic repeating units at its ends.

According to a preferred embodiment of the composition according to the invention the number of the ionic repeating units is smaller than the number of the non-ionic repeating units. Preferably, the number of the ionic repeating units is in the range of from 1 to 10, preferably in the range from 1 to 8, or preferably in the range from 1 to 5. Preferably, the number of the non-ionic repeating units is in the range of from 1 to 100, preferably in the range from 1 to 50, or preferably in the range from 1 to 20.

According to a preferred embodiment of the composition according to the invention the ratio of the number of the ionic repeating units to the number of the non-ionic repeating units is in the range of from 1:2 to 1:20 or preferably in the range of from 1:2.5 to 1:15, or preferably in the range of from 1:3 to 1:12.

According to a preferred embodiment of the composition according to the invention the ionic repeating unit comprises an acidic group, preferably selected from the group consisting of a carboxylate, a sulfate, a sulfonate, a phosphate, a phosphonate or a mixture of at least two thereof. Preferably, the ionic repeating unit comprises a sulfonate as functional group. Preferably, the ionic repeating unit is derived from a monomer selected from the group consisting of acrylate, methacrylate, maleic acrylate, styrenesulphonate, styrenedisulfonate, vinylsulphonate or a combination of at least two thereof. Especially preferably, the monomer is styrenesulphonate. The sulphonation of the ionic unit may be performed before or after the polymerization of the at least one polymeric anion d). Preferably, the sulphonation is performed after the polymerization of the at least one polymeric anion d).

According to a preferred embodiment of the composition according to the invention the non-ionic repeating unit is derived from a monomer selected from the group consisting of an alkylene group, a cycloalkylene group, an arylene group, an aralkylene group, a siloxane or a combination of at least two thereof, wherein the groups may optionally be substituted. The monomers the non-ionic repeating units are derived from may comprise branched hydrocarbon groups. Furthermore or alternatively, the monomers the non-ionic repeating units are derived from may comprise substituted hydrocarbons. Preferably, the substituted hydrocarbon is a hydrocarbon with at least one hetero atom selected from the group consisting of N, P, S, Si, O, Cl, F, J, Br, or a combination of at least two thereof.

The alkylene group may be any alkyl group the person skilled in the art would select for the composition. Preferably, the alkylene group is optionally branched and selected from the group consisting of an ethylene group, a propylene group, a butylene group, a pentylene group, a hexylene group, a heptylene group, an octylene group or a combination of at least two thereof.

The arylene group may be any aryl group the person skilled in the art would select for the composition. Preferably, the arylene group is optionally substituted and selected from the group consisting of a phenyl ethene group (styrene), a phenyl propene group, a phenyl butene group, a phenyl pentene group or a combination of at least two thereof. Preferably, the arylene group is a substituted phenylene group, wherein the substituent is selected from the group consisting of a tert-butyl group, a methyl group, an ethyl group or a combination of at least two thereof.

According to a particularly preferred embodiment of the composition according to the present invention the polymeric anion d) comprises polymerized sulfonated monomer units and polymerized non-sulfonated monomer units and wherein molar ratio of the non-sulfonated units is at least 5%, preferably at least 20% and most preferably at least 40% in each case based on the total amount of monomer units in the copolymer. Suitable copolymers comprising polymerized styrene monomer units at least a part of which is sulfonated and polymerized non-sulfonated units are, for example, disclosed in DE 10 2008 023008 A1. The polymeric anion that is obtained in Example 7 of DE 10 2008 023008 A1 can be considered as a particularly suitable polymeric anion d) in the present invention.

According to a more preferred embodiment of the composition according to the present invention the polymeric anion d) is a block-copolymer comprising polymerized sulfonated units and polymerized non-sulfonated units and wherein molar ratio of the non-sulfonated units is at least 5%, preferably at least 20% and most preferably at least 40% in each case based on the total amount of monomer units in the copolymer.

According to an even more preferred embodiment of the composition according to the present invention the polymeric anion d) is a block-copolymer comprising polymerized sulfonated polystyrene units and polymerized non-sulfonated units and wherein molar ratio of the non-sulfonated units is at least 5%, preferably at least 20% and most preferably at least 40% in each case based on the total amount of monomer units in the copolymer.

According to a further preferred embodiment of the composition according to the invention the polymeric anion d) is a hydrogenated styrene block copolymer with at least three blocks A, B and C, according to formula (Ib), wherein
I1. block A corresponds to a at least partially sulphonated polystyrene block;
I2. block B corresponds to a block of hydrogenated cis-polyisoprene with n from 10 to 1000

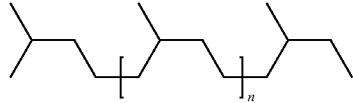

or a block of hydrogenated trans polyisoprene with n from 10 to 1000

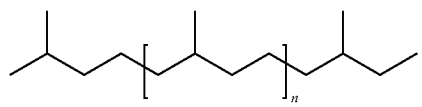

or a mixture thereof;
I3. block C corresponds to a polystyrene block which is at least partially substituted with tert-butyl groups.

Preferably, the polystyrene block representing block C is substituted with a tert-butyl group to an extent of 1 to 70%, or preferably to an extent of 5 to 60%, or preferably to an extent of 10 to 50%, based on the amount of phenyl units of the styrene group, whereby each phenyl unit is preferably substituted only at one position. Preferably, the phenyl unit of the polystyrene is substituted in a way that the tert butyl group is situated at the p-position of the phenyl unit.

Particularly preferred polymeric anions d) are hydrogenated or unhydrogenated, preferably hydrogenated styrene-isoprene block copolymers with the structure C-B-A-B-C, in which the block C corresponds to a polystyrene block which is at least partially substituted with tert-butyl groups, the block B corresponds to a hydrogenated or unhydrogenated, preferably however to a hydrogenated polyisoprene block (a fully hydrogenated polyisoprene block corresponds chemically to a block of alternating copolymerised ethylen-propylene units) and the block A corresponds to an at least partially sulphonated polystyrene block. The lengths of the blocks A, B and C is preferably at least 5 monomer units, particularly preferably at least 10 units and most preferably at least 20 units. Such copolymers are for example obtainable from the company Kraton Polymers, Houston, USA, under the product name NEXAR®.

According to a preferred embodiment of the composition according to the invention the molecular weight of the at least one polymeric anion d) is in the range of from 1,000 to 2,000,000 g/mol, preferably in the range from of 5,000 to 600,000 g/mol, or preferably in the range of from 10,000 to 400,000 g/mol. The molecular weight is determined by gel permeation chromatography using polymers of defined molecular weights, in particular using polystyrene in the case of solutions in water-immiscible solvents or using polystyrene sulphonic acid in the case of water-miscible solvents.

Preferably, the composition according to the present invention comprises the at least one polymeric anion d) in an amount of from 0.05 to 13 wt.-%, preferably from 0.2 to 12 wt.-% and most preferably from 0.5 to 10 wt.-%, in each case based on the total amount of the composition. If the composition comprises two or more polymer anions d), these amounts refer to the total amount of polymer anions.

Additives e)

The composition according to the present invention may comprise at least one further additive e). The at least one additive e) is preferably selected from the group consisting of binders, crosslinking agents, viscosity modifiers, pH regulators, additives which increase the conductivity, antioxidants, additives which modify work function, auxiliary solvents which are required, for example, for homogeneous mixing of the individual components or a mixture of two or more of these additives.

Preferably, the above mentioned additives are present in the composition in an amount of from 0 to 6 wt.-%, preferably in an amount of from 0.01 to 2.5 wt.-% and most preferably in an amount of from 0.1 to 2 wt.-%, in each case based on the total amount of the composition. If the composition comprises two or more additives e), these amounts refer to the total amount of additives.

The composition according to the present invention, in particular the composition that comprises a salt or a complex of a polythiophene as the conductive polymer b) and the polymeric anion d), can be prepared in different preparation methods. According to a first approach the salt or the complex are prepared by oxidatively polymerizing the monomers on which the conductive polymer b) is based, particularly preferred 3,4-ethylenedioxythiophene, in the presence of the polymeric anion d) ion in the at least one organic solvent a). According to a second approach the monomers are oxidatively polymerized in the presence of the polymeric anion d) in a protic solvent, particularly preferred in water, and the protic solvent is then substituted by the at least one organic solvent a). Such a solvent-substitution process is, for example, disclosed in U.S. Pat. No. 6,692,662 B2. In both approaches the at least one fluorinated compound c) can be added before, during or after the monomers on which the conductive polymer b) is based are/have been oxidatively polymerized in the presence of a polymeric anion d). According to a particularly preferred embodiment of this process the monomers on which the polythiophene is based, particularly preferred 3,4-ethylenedioxythiophene, is oxidatively polymerized in the presence of the polymeric anion d) ion in the at least one organic solvent a) and the at least one fluorinated compound c) is added after the formation of the conductive polymer:polymeric anion-complex.

The most advantageous process conditions for producing a composition that comprises a salt or a complex of a polythiophene as the conductive polymer b) and the polymeric anion d) of course will depend in particular on the solubility of the polymeric anion d) in the selected organic solvent a).

Oxidising agents that are suitable for the oxidative polymerisation of the monomers on which the conjugated polymers are based can be used as oxidising agents. For practical reasons, inexpensive and easy-to-handle oxidising agents are preferred, for example iron(III) salts such as $FeCl_3$, $Fe(ClO_4)_3$ and the iron(III) salts of organic acids and of inorganic acids comprising organic radicals. The iron(III) salts of sulphuric acid hemiesters of $C_1$-$C_{20}$ alkanols, for example the Fe(III) salt of lauryl sulphate, are cited by way of example as iron(III) salts of inorganic acids comprising organic radicals. The following are cited by way of example as iron(III) salts of organic acids: the Fe(III) salts of $C_1$-$C_{20}$ alkyl sulphonic acids, such as methane- and dodecane-sulphonic acid; aliphatic $C_1$-$C_{20}$ carboxylic acids such as 2-ethylhexyl carboxylic acid; aliphatic perfluorocarboxylic acids, such as trifluoroacetic acid and perfluorooctanoic acid; aliphatic dicarboxylic acids such as oxalic acid and above all of aromatic sulphonic acids optionally substituted with $C_1$-$C_{20}$ alkyl groups, such as benzenesulphonic acid, p-toluenesulphonic acid and dodecylbenzenesulphonic acid. The iron(III) salts of organic acid have the big applicational advantage that they are partially or completely soluble in organic solvents and in particular in water-immiscible organic solvents. Organic peroxides such as for example tert-butyl peroxide, diisobutyryl peroxide, di-n-propyl peroxydicarbonate, didecanoyl peroxide, dibenzoyl peroxide, tert-butyl peroxybenzoate, di-tert-amyl peroxide can also be used as oxidising agents. The preferred oxidizing agent also depends on the solubility of the oxidizing agent in the organic solvent a).

The above described properties, amounts and configurations concerning the at least one organic solvent a), the at least one conductive polymer b), the at least one fluorinated compound c) and the at least one polymeric anion d) are also valid for the layered structure, the device, the process for producing the composition and the process for producing the layered structure.

According to a preferred embodiment of the composition according to the present invention the composition provides at least one of the following properties:
a. a viscosity in the range from 0.1 and 1,000 mPa·s, preferably in the range of from 0.5 to 800 mPa·s and more preferably in the range of from 1 to 500 mPa·s;
b. a water content of not more than 2 wt.-%, preferably not more than 0.5 wt.-% and more preferably not more than 0.3 wt.-%;
c. particles of the composition having a particle diameter ($d_{50}$) of 700 nm or less, or preferably having a particle diameter ($d_{50}$) of 600 nm or less, or preferably having a particle diameter ($d_{50}$) of 500 nm or less.

According to a preferred embodiment of the composition according to the present invention the composition comprises:
a) 70 to 99.5 wt.-%, preferably 75 to 96 wt.-%, and more preferably 80 to 95 wt.-% of the at least one organic solvent;
b) 0.05 to 4 wt.-%, preferably 0.2 to 3.9 wt.-% and more preferably 0.5 to 3.5 wt.-% of the at least one conductive polymer;
c) 0.05 to 10 wt.-%, preferably 0.2 to 9 wt.-% and more preferably 0.5 to 8 wt.-% of at least one fluorinated compound;
d) 0.05 to 13 wt.-%, preferably 0.2 to 12 wt.-% and more preferably 0.5 to 10 wt.-% of at least one polymeric anion;
e) 0 to 6 wt.-%, preferably 0.01 to 2.5 wt.-% and more preferably 0.1 to 2 wt.-% of at least one further additive;
wherein the sum of the composition a) to e) is 100 wt.-%.

The weight ratio of the at least one conductive polymer b), preferably of the polythiophene, to the at least one polymeric anion d) (polythiophene:polymeric anion) in the composition is preferably in a range from 1:0.1 to 1:100, or preferably in a range from 1:0.2 to 1:20 and particularly preferably in a range from 1:0.5 to 1:10.

Preferably, the water content of the composition according to the present invention is not more than 2 wt.-%, preferably not more than 0.5 wt.-%, or preferably not more than 0.3 wt.-%, based on the total weight of the composition. The water content is determined by the test method disclosed herein (the test method "Water content measurement by Karl-Fischer titration").

Layered Structure

A contribution towards solving at least a part of the above mentioned objects is also made by a layered structure comprising the following layers:
i. a substrate with a first surface;
ii. a first layer superimposing at least a part of the first surface of the substrate, wherein the first layer comprises:
b) at least one conductive polymer;
c) at least one fluorinated compound;
d) at least one polymeric anion, wherein the at least one polymeric anion is a copolymer comprising ionic and non-ionic repeating units.

Preferred conductive polymers b), polymeric anions d) and fluorinated compounds c) are those polymers, anions and compounds that have already been mentioned as preferred conductive polymers b), polymeric anions d) and fluorinated compounds c) in connection with the composition according to the present invention.

Plastic films in particular are preferred as the substrate in this context, most particularly preferably transparent plastic films, which conventionally have a thickness in a range from 5 to 5000 µm, particularly preferably in a range from 10 to 2500 µm and most preferably in a range from 100 to 1000 µm. Such plastic films can be based for example on polymers such as polycarbonates, polyesters such as for example PET and PEN (polyethylene terephthalate and polyethylene naphthalene dicarboxylate), copolycarbonates, polysulphones, polyether sulphones (PES), polyimides, polyamides, polyethylene, polypropylene or cyclic polyolefins or cyclic olefin copolymers (COC), polyvinyl chloride, polystyrene, hydrogenated styrene polymers or hydrogenated styrene copolymers. In addition to plastic materials, substrates based in particular on metals or metal oxides are also suitable as substrates, such as for example ITO layers (indium-tin-oxide layers) or the like. Glass too can be used as a substrate.

The conductivity of the layered structure made by superimposing a glass substrate with a composition according to the invention and drying the thus obtained layer structure for 3 minutes at 200° C. on a hot plate is preferably at least $10^{-6}$ S/cm, more preferably at least $10^{-4}$ S/cm and most preferably at least $10^{-3}$ S/cm.

Preferably, the first layer of the layered structure comprises the at least one fluorinated compound c) in an amount in a range from 5 to 80 wt.-%, or preferably in a range from 10 to 60 wt.-%, or preferably in a range from 20 to 50 wt.-%, based on the total weight of the composition.

According to a preferred embodiment of the layered structure according to the present invention the layered structure displays at least one, preferably all of the following properties:
(α1) an electrical conductivity in the range of from $10^{-6}$ S/cm to 10,000 S/cm, preferably from $10^{-4}$ S/cm to 1,000 S/cm and most preferably from $10^{-3}$ S/cm to 100 S/cm;
(α2) a transmission at 550 nm of more than 70%, preferably more than 80% and most preferably more than 90%;
(α3) a haze of less than 10%, preferably less than 8% and most preferably less than 6%;
($α^4$) a surface roughness Ra of less than 100 nm, preferably less than 50 nm and most preferably less than 30 nm.

Process for the Production of a Layered Structure

A contribution towards solving at least a part of the above mentioned objects is also made by a process for the production of a layered structure, comprising the process steps:
I) providing of a substrate with a first surface;
II) superimposing the substrate at least partially on its first surface with a composition according to the present invention;
III) at least partial removal of the at least one organic solvent a) from the composition, thereby obtaining an electrically conductive layer superimposed on the substrate.

Preferred substrates are those that have been mentioned in connection with the layered structure according to the present invention.

Superimposing at least a part of the substrate surface with the composition according to the invention in process step II) can be accomplished by known methods, for example by spin coating, dipping, pouring, dropping on, injecting, spraying, film transfer application, knife application, spreading or printing, for example inkjet, screen, intaglio, offset or pad printing, in a wet film thickness of 0.1 μm to 250 μm, preferably in a wet film thickness of 0.5 μm to 50 μm.

Optionally, the composition according to the invention is not directly applied to the substrate. In this particular embodiment the substrate can be at least partially covered with one or two additional layers before it is superimposed with the composition in process step II).

Suitable additional layers that can be mentioned in this context comprise a photoactive layer or inorganic hole transport layers such as layers comprising nickel oxide, molybdenum oxide or wolfram oxide, organic hole transporting layers such as layers comprising spiro-OMeTAD (2,2',7,7'-tetra-kis-(N,N-di-pmethoxyphenylamine)-9,9'-spirobifluorene)), P3HT (poly(3-hexylthiophene)), PCPDTBT (Poly[2,1,3-benzothiadiazole-4,7-diyl[4,4-bis(2-ethylhexyl)-4H-cyclopenta[2,1-b:3,4-b']dithiophene-2,6-diyl]]), PVK (poly(N-vinylcarbazole)), HTM-TFSI (1-hexyl-3-methylimidazolium bis(trifluoromethylsulfonyl)imide), Li-TFSI (lithium bis(trifluoromethanesulfonyl)imide), tBP (tert-butylpyridine) or PTTA (Poly[bis(4-phenyl)(2,4,6-trimethylphenyl)amine]), exciton blocking layer oder thin isolating layers. Additional layers can also be based on a material selected from the group consisting of CuI (copper iodide), polyanilline, CuSCN (copper(I) thiocyanate), 4,4', 4"-Tris[phenyl(m-tolyl) amino] triphenylamine (m-MTDATA), poly- and oligo-triarylamine (PTAA) and carbazole based small molecules.

In process step III) of the process according to the present invention the at least one organic solvent a) is at least partially removed from the composition superimposed in process step II), thereby obtaining an electrically conductive layer superimposed on the substrate. Partial removal of the at least one organic solvent a) can be achieved by simply drying the superimposed layer, preferably by heating the substrate and/or the optional additional layers to a temperature in the range from 10 to 230° C., wherein the drying conditions are of course dependent from the boiling point of the at least one organic solvent a). Preferably, the temperature is selected in a range of from 20 to 200° C. It is, however, also possible to at least partially remove the at least one organic solvent a) by means of IR- or vacuum drying.

A contribution towards solving at least a part of the above mentioned objects is also made by a layered structure obtained by the process for the production of a layered structure according to the invention.

A Device

A contribution towards solving at least a part of the above mentioned objects is also made by a device comprising a layered structure according to the invention. Preferably, the device is an electronic device, especially an electroluminescent device. Electroluminescent devices may form the main part of displays, like OLEDs or touchscreens, or solar cells, like organic solar cells or hybrid solar cells.

According to a preferred embodiment of the invention the device is selected from the group consisting of an OLED, a display, an organic solar cell, a hybrid solar cell, a field effect transistor, a touchscreen or a thermoelectric generator or a combination of at least a two thereof.

As an example of a device according to the invention, an OLED is described in detail. The OLED, the hole-injection layer of which has been prepared using the composition according to the present invention can, for example, exhibit any of the following layer structures (a) to (h):
(a) anode/
hole-injection layer/
at least one emitter layer/
cathode;
(b) anode/
hole-injection layer/
hole-transport layer/
at least one emitter layer/cathode;
(c) anode/
hole-injection layer/
at least one emitter layer/
electron-injection layer/
cathode;
(d) anode/
hole-injection layer/
hole-transport layer/
at least one emitter layer/
electron-injection layer/
cathode;
(e) anode/
hole-injection layer/
at least one emitter layer/
electron-transport layer/
cathode;
(f) anode/
hole-injection layer/
hole-transport layer/
at least one emitter layer/
electron-transport layer/
cathode;
(g) anode/
hole-injection layer/
at least one emitter layer/ electron-transport layer/
electron-injection layer/
cathode;
(h) anode/
hole-injection layer/
hole-transport layer/
at least one emitter layer/
electron-transport layer/
electron-injection layer/
cathode.

The layer structures (a) to (h) can be embodied either with the anode located next to the substrate, the substrate being, for example, glass or a transparent plastic film, or with the cathode located next to the substrate.

The anode layer is preferably based on indium tin oxide, indium zinc oxide, fluorine-doped tin oxide, tungsten trioxide, titanium dioxide, molybdenum trioxide, aluminium zinc oxide, gallium indium zinc oxide, aluminium, silver, palladium, copper, gold, platinum, and alloys thereof, for example silver-palladium-copper and molybdenum-chrome.

Suitable materials for the emitter layer are conjugated polymers such as polyphenylene-vinylenes and/or polyfluorenes, for example, the polyparaphenylenevinylene derivatives and polyfluorene derivatives described in WO-A-90/13148, or emitters from the class of low molecular emitters, also termed "small molecules" in technical circles, such as aluminium complexes, such as, for example, tris(8-hydroxyquinolinato)aluminium ($Alq_3$), fluorescence dyes, e.g. quinacridones, or phosphorescent emitters such as, for example, $Ir(ppy)_3$. Further suitable materials for the emitter layer are described e.g. in DE-A-196 27 071. Particularly preferred as emitter layer, according to the invention, is tris(8-hydroxyquinolinato)aluminium ($Alq_3$).

Preferred as the injection layer are single Ca layers or a stack structure consisting of a Ca layer and another layer, which consists of one or more materials selected from the group IA and IIA metals of the periodic table, excluding Ca, which exhibit a work function from 1.5 to 3.0 eV, and oxides, halogenides and carbonates thereof. Examples of group IA metals of the periodic table which exhibit a work function from 1.5 to 3.0 eV, and oxides, halogenides and carbonates thereof, are lithium, lithium fluoride, sodium oxide, lithium oxide and lithium carbonate. Examples of group IIA metals of the periodic table, excluding Ca, which exhibit a work function from 1.5 to 3.0 eV, and oxides, halogenides and carbonates thereof, are strontium, magnesium oxide, magnesium fluoride, strontium fluoride, barium fluoride, strontium oxide and magnesium carbonate.

The electron transport layer can consist of materials such as, for example, oxadiazol derivatives, anthraquinodimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives and metal complexes of 8-hydroxyquinoline or derivatives thereof, polyquinoline or derivatives thereof, polyquinoxaline or derivatives thereof or polyfluorene or derivatives thereof.

Particularly suitable materials for the cathode layer are transparent or translucent materials with a relatively low work function (preferably lower than 4.0 eV). Examples of this type of material are metals, such as lithium (Li), sodium (Na), potassium (K), rubidium (Rb), caesium (Cs), Be, magnesium (Mg), calcium (Ca), strontium (Sr), barium (Ba), aluminium (Al), scandium (Sc), vanadium (V), Zn, yttrium (Y), indium (In), cerium (Ce), samarium (Sm), Eu, Tb and ytterbium (Yb); alloys consisting of two or more of these metals; alloys consisting of one or more of these metals and one or more metals selected from Au, Ag, Pt, Cu, manganese (Mn), titanium (Ti), cobalt (Co), nickel (Ni), wolfram (W) and tin (Sn); graphite or graphite intercalation compounds; and metal oxides, such as, for example, ITO and tin oxide. Particularly preferable is the use of aluminium as the cathode layer.

The application of the emitter layer, of the electron injection layer and of the cathode injection layer can be carried out in a manner known to a person skilled in the art, preferably through vapour coating such as is described, for instance, in WO-A-2009/0170244.

Use of Composition

A contribution towards solving at least a part of the above mentioned objects is also made by a use of the composition according to the invention in an electrically conductive layer of a layered structure according to the invention for increasing the device-service-life-time. The device-service-life-time in connection with the invention is defined as the life-time of the device after its last production step.

A contribution towards solving at least a part of the above mentioned objects is also made by a use of the composition according to the invention for the preparation of a hole-injection layer of an OLED.

The invention is now explained in more detail with the aid of test methods and non-limiting FIGURES and examples.

FIG. 1 shows an OLED with a standard architecture and encapsulation. The structure is as follows:
glass substrate (1)
ITO bottom electrode (2)
PEDOT hole-injection layer (3)
NPB hole-transport layer (60 nm) (4)
Alq3 emitter layer (50 nm) (5)
LiF top electrode (0.3 nm) (6)
Al layer (moisture trap) (200 nm) (7)
cover glass (8)
sealant (glue) (9)

The PEDOT hole-injection layer (3) can be prepared with the composition according to the present invention.

Test Methods

To evaluate the functional behaviour of a layer of the composition employed in the process according to the invention concerning the layered structure or the device, the procedure is as follows:

Viscosity

The viscosity is measured using a Rheometer (Haake RV1). The rheometer is equipped with a thermostat, a DG 43 beaker (Haake) and a DG 43 rotary (Haake). 12 ml of the dispersion are filled into the beaker. The temperature is fixed at 20° C. using the thermostat. In order to equilibrate the temperature the liquid is kept at a sheer-rate of 50 s-1 for 240 seconds. Subsequently the sheer-rate is increase to 100 $s^{-1}$ or 700 $s^{-1}$ (see each measurement). The liquid is then kept for 30 seconds at this sheer-rate. Over the next 30 seconds 30 viscosity measurements are made at the above mentioned sheer-rate (1 measurement/second). The average of those 30 measurements is the final viscosity value.

Solids Content:

The solids content was determined gravimetric using a precision scale (Mettler AE 240). First the empty weighing bottle including lid is weight (weight A). Then about 3 g of dispersion to be analyzed is filled quickly into the bottle, closed by the lid and weighed again to determine the exact total weight B. The bottle is then placed in a fume hood without a lit for about 3 hours to allow the evaporation of volatile solvents at room temperature. In a second step the bottle is placed in a drying oven with ventilation (Memmert UNB200) at 100° C. for 16 hours. When the sample bottle is removed from the oven, immediate coverage by the glass lid is important due to the hygroscopic nature of the dry dispersion material. After 10-15 min of cooling down period the bottle is weighed again including lid to determine weight C. There is always a repeat determination of 2 samples.

Calculation of the solids contents: wt. % solids content=$100\times(C-A)/(B-A)$

Water Contents Measurement by Karl-Fischer Titration:

The water content is determined by Karl Fischer titration. A Metrohm 787 KF Titrino with a 703 titration stand is used to this end. The titration vessel is filled with analytical grade methanol so that about 1 cm of the platinum electrode is submerged. Then approximately 5 ml of Hydranal buffer acid is pipetted in. The titration cell is automatically dried by starting the KFT program. Preparation is complete when the message "KFT conditioned" appears. Approximately 5 ml of the dispersion to be analysed is then introduced into the titration vessel using a syringe and the exact mass of the dispersion used is determined by back-weighing the syringe. The titration is then started. The measured value is determined as the mean of three individual measurements.

Kelvin Probe:

The dispersion was spin-coated on ozonized ITO, dried for 15 min at 200° C. and the work function was determined via Kelvin probe force microscopy.

Production of OLEDs:

A) Substrate Cleaning

ITO-precoated and pre-patterned (by etching, pattern: 2×4 parallel ITO stripes, 2 mm wide to allow for 8 individually connected diodes, OPTREX) glass substrates (5 cm×5 cm) are cleaned by the following process before use:
1. thorough rinsing with acetone, isopropanol and water,
2. ultrasound treatment in a bath at 70° C. in a 0.3% strength Mucasol solution (Merz) for 15 min,
3. thorough rinsing with water,
4. drying by spinning off in a centrifuge,
5. UV/ozone treatment (PR-100, UVP Inc., Cambridge, GB) for 15 min directly before use.

B) Application of the Hole Injection Layer (HIL): PEDOT: Counterion-Layer

For the production of the PEDOT:counter-ion layer HIL the composition is first filtered by a 0.45 μm PVDF syringe filter and then applied onto the above mentioned substrate or electrode layer (layer sequence glass substrate/ITO). The coating composition was applied onto the electrode by means of a pipette to completely cover the area. Excess dispersion was spun off by spin coating. Thereafter, a drying process on a hot-plate was carried out in one step: 5 min at 200° C. in air. This leads to an approximately 50 nm thick homogenous layer. The layer thickness was measured by profilometer (Tencor, Alphastep 500).

C) Application of the Hole-Transport and Emitter Layer

The ITO substrate which was coated by the dispersion of invention in the previous step is now transferred into to a vacuum vapour deposition chamber (Univex 350, Leypold). Here the hole transport layer N,N'-bis(naphthalene-1-yl)-N,N'-bis(phenyl)benzidine (NPB) with a thickness of 60 nm followed by tris-(8-hydroxyquinoline)aluminium (Alq3) of 50 nm thickness are deposited. The pressure during deposition is $<5\times10^{-6}$ mbar. The deposition rate is 1 Angstrom/s. Rate and layer thickness are monitored by quartz crystal microbalances (QCMs).

D) Cell Application of the Metal Cathode

The layer system is then transferred to a glovebox with nitrogen and integrated vacuum deposition system (Edwards) and metallised with metal electrodes. To this end the substrate is placed on a shadow mask with the layer system facing downwards. The shadow mask comprises of 2 mm wide rectangular slots, which cross the ITO strips at right angles. Under a pressure of $<5\times10^{-6}$ mbar, a 0.3 nm thick LiF layer followed by a 200 nm thick aluminium layer are deposited in succession from two evaporation boats. The deposition rates are 1 Angstrom/s for LiF and 10 Angstrom/s for Al. The surface area of the individual OLEDs is 4.0 mm$^2$. The devices are then encapsulated with a special cover glass providing a void on the inside. In this void a moisture getter (SAES, DFX/SS-30-A/F/10×18×0.14) is placed. The cover glass is glued onto the device under nitrogen using a two-component glue. Now the devices were ready for OLED characterisation in air.

Schematic of an OLED with this Standard Architecture glass//ITO//PEDOT HIL//NPB (60 nm)//Alq3 (50 nm)// LiF(0.3 nm)//Al(200 nm)

can be seen in FIG. 1.

E) OLED Characterization

The two electrodes of the OLED are connected to (brought into contact with) a power supply using electrical wires and contact pins. The positive pole is connected to the ITO electrode, the negative pole to the metal electrode. The OLED current and the electroluminescence intensity are plotted against the voltage. The electroluminescence is detected with a photodiode (EG&G C30809) calibrated with a luminance meter (Minolta LS-100) to absolute luminance. The live time is then determined by applying a constant current of I=1.92 mA (48 mA/cm$^2$) to the arrangements and monitoring the voltage and light intensity as a function of time.

Electrical Conductivity:

The electrical conductivity means the inverse of the specific resistance. The specific resistance is calculated from the product of surface resistance and layer thickness of the conductive polymer layer. The surface resistance is determined for conductive polymers in accordance with DIN EN ISO 3915. In concrete terms, the polymer to be investigated is applied as a homogeneous film by means of a spin coater to a glass substrate 50 mm×50 mm in size thoroughly cleaned by the abovementioned substrate cleaning process. In this procedure, the coating composition was applied onto the electrode by means of a pipette to completely cover the area. Excess dispersion was spun off by spin coating using the same conditions as in the section "Application of the hole injection layer (HIL):PEDOT:counterion layer." This leads to an approximately 50 nm thick homogenous layer for all materials.

In all cases silver electrodes of 2.0 cm length at a distance of 2.0 cm are vapour-deposited on to the polymer layer via a shadow mask. The square region of the layer between the electrodes is then separated electrically from the remainder of the layer by scratching two lines with a scalpel. The surface resistance is measured between the Ag electrodes with the aid of an ohmmeter (Keithley 614). The thickness of the polymer layer is determined with the aid of a Stylus Profilometer (Dektac 150, Veeco) at the places scratched away.

The invention is now explained in more detail with the aid of test methods and non-limiting examples.

EXAMPLES

Example 1: PEDOT:Counterion-Complex in MTBE without Fluorinated Compound (Comparative Example)

In a 1 L three-necked round-bottom flask equipped with mechanical stirrer 7.9 g of 3,4-ethylenedioxythiophene (Heraeus Deutschland GmbH & Co KG, Germany) were added to a mixture of 130 g of methyl tert-butyl ether (MTBE), 215 g of a solution of sulfonated block-copolymer in cyclohexane/heptane-mixture (Kraton Nexar MD 9150, 11.0% solids) and 9 g of para-toluene sulfonic acid (Aldrich) and stirred for 30 min. 15 g of dibenzoylperoxide (Aldrich) were added and the mixture was heated to reflux. After 6 h the mixture was allowed to cool to room temperature and diluted with 1175 g of methyl tert-butyl ether. After two days residual solids were filtered off and the filtrate was purified by diafiltration (ceramic membrane filter (Pall Schumasiv), pore size 50 nm, part number 88519721) in order to remove low molecular weight impurities <50 nm.
Analysis:
  Solids content: 2.1% (gravimetric)
  Water content: 0.2% (Karl-Fischer-Titration)
  Solvent composition: 88% methyl tert-butyl ether, 6% cyclohexane, 6% n-heptane;
  Ratio PEDOT:counter-ion: 1:3 (w/w)
  Work function: 4.87 eV (Kelvin Probe)

Example 2: PEDOT:Counterion-Complex in MTBE without Fluorinated Compound (Comparative Example)

100 g of Example 1 are mixed with 200 g of methyl tert-butyl ether. The material is filtered through 0.45 µm.
Analysis:
  Solvent composition: 96% methyl tert-butyl ether, 2% cyclohexane, 2% n-heptane;
  Conductivity: $2.1 \times 10^{-4}$ S/cm Example 3: PEDOT:Counterion-Complex in MTBE with Fluorinated Compound (Inventive Example)

0.5 g of 1H,1H,2H,2H-perfluorodecyl triethoxysilane were added to 55 g of the dispersion obtained in example 1 and sonicated for 10 h and filtered through a filter with a pore size of 0.45 µm. 50 g of this mixture are mixed with 100 g of tert-butyl methyl ether. The material is filtered through 0.45 µm.
Analysis
  Water content: <0.1% (Karl-Fischer-Titration)
  Solvent composition: 96% methyl tert-butyl ether, 2% cyclohexane, 2% n-heptane;
  Work function: 5.70 eV (Kelvin Probe)
  Conductivity: $9 \times 10^{-5}$ S/cm Example 4: PEDOT:Counterion-Complex in Butyl Benzoate without Fluorinated Additive (Comparative Example)

In a 1 L three-necked round-bottom flask equipped with mechanical stirrer a mixture of 401 g of butyl benzoate (ABCR GmbH), 233 g of a solution of sulfonated block-copolymer in butyl benzoate (Kraton Nexar MD 9150, 11.8% solids) and 24 g of dibenzoyl peroxide was stirred and purged with nitrogen for 30 min. The mixture was heated to 60° C. and 12.5 g of 3,4-ethylenedioxythiophene (Heraeus Deutschland GmbH & Co KG, Germany) and 45 g butyl benzoate were added via syringe. After stirring 6 h at 60° C. and 1 h at 130° C. the mixture was allowed to cool to room temperature. 732 g of the dispersion were diluted with 1320 g of butyl benzoate. The resulting dispersion was sonicated for 8 h and filtered (pore size 0.2 µm).
Analysis
  Solvent composition: 100% butyl benzoate
  Conductivity: $2.0 \times 10^{-3}$ S/cm Example 5: PEDOT:Counterion-Complex in Butyl Benzoate with Fluorinated Compound (Inventive Example)

0.05 g of pentafluorostyrene/tert-butylstyrene copolymer (momomer ratio 90/10; ABCR GmbH, Karlsruhe, Germany) were added to 9.95 g of the dispersion of example 3 and the mixture was stirred for 1 h at 60° C. until the polymer was completely dissolved.
  Solvent composition: 100% butyl benzoate
  Conductivity: $2.3 \times 10^{-3}$ S/cm Example 6: OLED-Device Testing of Example 2 and 3 as Hole Injection Layer The dispersion from Examples 2 and 3 were used to prepare OLEDs. The film thickness of the layers according to the invention was 50 nm. The graphs plotting current and electroluminescence against voltage and the lifetime measurements for the OLEDs are compared. For the OLED diode characteristics at the lifetime measurement the values for voltage and luminance are extracted at constant current 48 mA/cm$^2$ (forward bias). The voltage and luminance at t=0 h are $U_0$ and $L_0$ respectively. The efficacy at $U_0$ is calculated as the quotient of $L_0$/current I. As a measure of stability the voltage and luminance at t=150 h including $U_{150h}$, $L_{150h}$, the percentage of initial luminance ($L_0/L_{150h} \times 00$) and the voltage increase $U_{150h} - U_0$ are stated showing the change.

TABLE 1

OLED characteristics for example 3 containing a small molecule fluorinated compound according to the invention and example 2 as a reference comparing voltage and luminance at constant current of 48 mA/cm² at time 0 h and after 150 h as a life time measurement. (Initial Voltage $U_0$; Initial Luminance $L_0$; Efficiency at initial voltage; Voltage after 150 h $U_{150\ h}$; Luminance after 150 h $L_{150\ h}$; Luminance decrease $L_{150\ h}/L_{0\ h}$; Voltage increase $U_{150\ h} - U_0$)

| | Device data of ITO//HIL//NPB//ALQ₃//LiF//Al OLEDs at I = const. = 48 mA/cm² | | | | | | |
|---|---|---|---|---|---|---|---|
| | $U_0$ [V] | $L_0$ [cd/m²] | Efficacy at $U_0$ [cd/A] | $U_{150\ h}$ [V] | $L_{150\ h}$ [cd/m²] | $L_{150\ h}/L_0$ [%] | $U_{150\ h} - U_0$ [V] |
| Example 3 (inventive) | 5.12 | 1018 | 2.12 | 5.82 | 860 | 84 | 0.70 |
| Example 2 (comparative) | 6.33 | 1169 | 2.44 | 7.31 | 893 | 76 | 0.98 |

The example demonstrates that the dispersions according to example 3 shows a great improvement as hole injection with lower initial voltage, less voltage increase over time and improved life-time stability compared to example 2.

Example 7: OLED Device Testing of Example 4 and 5

The dispersions from Example 4 and 5 were used to prepare OLEDs. The film thickness of the layers according to the invention was 50 nm.

The graphs plotting current and electroluminescence against voltage and the lifetime measurements for the OLEDs are compared. For the OLED diode characteristics at the lifetime measurement the values for voltage and luminance are extracted at constant current 48 mA/cm² (forward bias). The voltage and luminance at t=0 h are $U_0$ and $L_0$ respectively. The efficacy at $U_0$ is calculated as the quotient of $L_0$/current I. As a measure of stability the voltage and luminance at t=150 h including $U_{150h}$, $L_{150h}$, the percentage of initial luminance ($L_0/L_{150h}*100$) and the voltage increase $U_{150h}-U_0$ are stated showing the change.

TABLE 2

OLED characteristics for example 4 and 5 comparing voltage and luminance at constant current of 48 mA/cm² at time 0 h and after 150 h as a life time measurement. (Initial Voltage $U_0$; Initial Luminance $L_0$; Efficacy at initial voltage; Voltage after 150 h $U_{150\ h}$; Luminance after 150 h $L_{150\ h}$; Luminance decrease $L_{150\ h}/L_{0\ h}$; Voltage increase $U_{150\ h} - U_0$)

| | Device data of ITO//HIL//NPB//ALQ₃//LiF//Al OLEDs at I = const. = 48 mA/cm² | | | | | | |
|---|---|---|---|---|---|---|---|
| | $U_0$ [V] | $L_0$ [cd/m²] | Efficacy at $U_0$ [cd/A] | $U_{150\ h}$ [V] | $L_{150\ h}$ [cd/m²] | $L_{150\ h}/L_0$ [%] | $U_{150\ h} - U_0$ [V] |
| Example 5 (inventive) | 5.95 | 1069 | 2.23 | 6.34 | 843 | 79 | 0.39 |
| Example 4 (comparative) | 7.36 | 1277 | 2.66 | 8.37 | 760 | 60 | 1.01 |

The example demonstrates that the dispersions according to example 5 shows a great improvement as hole injection with lower initial voltage, less voltage increase over time and improved life-time stability compared to example 4.

The invention claimed is:

1. A composition comprising:
   a) at least one organic solvent;
   b) at least one conductive polymer;
   c) at least one fluorinated compound, wherein the at least one fluorinated compound is a non-ionic compound;
   d) at least one polymeric anion, wherein the at least one polymeric anion is a copolymer comprising ionic and non-ionic repeating units.

2. The composition according to claim 1, wherein copolymer comprises polymerized styrene monomer units at least a part of which is sulfonated and polymerized non-sulfonated monomer units and wherein molar ratio of the non-sulfonated monomer units is at least 5%, based on the total amount of monomer units in the copolymer.

3. The composition according to claim 1, wherein the copolymer is a hydrogenated styrene-isoprene block copolymer with the structure A-B-C-B-A, in which the block A corresponds to a polystyrene block which is at least partially substituted with tert-butyl groups, the block B corresponds to a block of alternating copolymerised ethylen-propylene units and the block C corresponds to a sulphonated polystyrene block.

4. The composition according to claim 1, wherein the at least one organic solvent a) is selected from the group consisting of an aprotic, a polar, a non-polar and a non-polar, aprotic organic solvent or a mixture of at least two of these.

5. The composition according to claim 1, wherein the composition comprises as the at least one fluorinated compound c) a compound comprising at least one aliphatic or aromatic residue in which at least 10% of the hydrogen atoms are substituted by fluorine atoms.

6. The composition according to claim 1, wherein the composition comprises as the at least one fluorinated compound c) a fluorinated compound having a molecular weight of less than 2,100 g/mol.

7. The composition according to claim 1, wherein the at least one fluorinated compound c) is a mono-, di- or trialkoxysilane, in which at least one fluorinated aliphatic or a fluorinated aromatic group is bond to the Si atom.

8. The composition according to claim 1, wherein the at least one fluorinated compound c) is a polymeric fluorinated compound.

9. The composition according to claim 1, wherein the at least one fluorinated compound c) has a vapor pressure of less than 40 mbar at 100° C. (determined at a pressure of 1 bar).

10. The composition according to claim 1, wherein the at least one conductive polymer b) is a cationic polythiophene.

11. The composition according to claim 10, wherein the cationic polythiophene and the at least one polymeric anion d) are present in the form of a polythiophene: polymeric anion-complex.

12. The composition according to claim 1, wherein the composition comprises:
   a) 70 to 99.5 wt.-% of the at least one organic solvent;
   b) 0.05 to 4 wt.-% of the at least one conductive polymer;
   c) 0.05 to 10 wt.-% of the at least one fluorinated compound;
   d) 0.05 to 13 wt.-% of the at least one polymeric anion;
   e) 0 to 6 wt.-% of at least one further additive;
   wherein the sum of components a) to e) is 100 wt.-%.

13. The composition according to claim 1, wherein the water content of the composition is not more than 2 wt.-%, based on the total weight of the composition.

14. A process for the production of a layered structure, comprising the process steps:
   I) providing of a substrate with a first surface;
   II) superimposing the substrate at least partially on its first surface with a composition according to claim 1;
   III) at least partially removing the at least one organic solvent a) from the composition, thereby obtaining an electrically conductive layer superimposed on the substrate.

15. A layered structure obtainable by the process according to claim 14.

16. A layered structure comprising the following layers:
   i. a substrate with a first surface;
   ii. a first layer superimposing at least a part of the substrate surface; wherein the first layer comprises:
      a) at least one conductive polymer;
      b) at least one fluorinated compound, wherein the at least one fluorinated compound is a non-ionic compound;
      c) at least one polymeric anion, wherein the at least one polymeric anion is a copolymer comprising ionic and non-ionic repeating units.

17. The layered structure according to claim 16, wherein
   (i) the at least one conductive polymer is a cationic polythiophene;
   (ii) the at least one fluorinated compound is a compound comprising at least one aliphatic or aromatic residue in which at least 10% of the hydrogen atoms are substituted by fluorine atoms; and
   (iii) the at least one polymeric anion is a copolymer comprising polymerized styrene monomer units at least a part of which is sulfonated and polymerized non-sulfonated monomer units, and wherein the molar ratio of the non-sulfonated monomer units is at least 5%, based on the total amount of monomer units in the copolymer.

18. A device comprising a layered structure according to claim 16.

19. The device according to claim 18, wherein the device is selected from the group consisting of an OLED, a display, an organic solar cell, a hybrid solar cell, a field effect transistor, a touchscreen or a thermoelectric generator or a combination of at least two thereof.

* * * * *